(12) United States Patent
Park

(10) Patent No.: US 10,984,865 B2
(45) Date of Patent: Apr. 20, 2021

(54) THREE-DIMENSIONAL NON-VOLATILE MEMORY DEVICE AND METHOD OF MANUFACTURING THE SAME

(71) Applicant: SK hynix Inc., Icheon-si (KR)

(72) Inventor: Eun Young Park, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/562,149

(22) Filed: Sep. 5, 2019

(65) Prior Publication Data
US 2020/0265893 A1    Aug. 20, 2020

(30) Foreign Application Priority Data
Feb. 14, 2019    (KR) .................. 10-2019-0017445

(51) Int. Cl.
*G11C 16/04*    (2006.01)
*G11C 16/24*    (2006.01)
*G11C 16/14*    (2006.01)

(52) U.S. Cl.
CPC .......... *G11C 16/0483* (2013.01); *G11C 16/14* (2013.01); *G11C 16/24* (2013.01)

(58) Field of Classification Search
CPC ...... G11C 16/0483; G11C 16/24; G11C 16/14
See application file for complete search history.

(56) References Cited

U.S. PATENT DOCUMENTS

| | | |
|---|---|---|
| 2014/0334230 A1 | 11/2014 | Kwon |
| 2016/0141011 A1 | 5/2016 | Lee |
| 2016/0260483 A1* | 9/2016 | Shano .................. G11C 29/82 |
| 2017/0213843 A1 | 7/2017 | Choi |
| 2018/0218774 A1* | 8/2018 | Kimura ............... H01L 27/1157 |
| 2020/0203180 A1* | 6/2020 | Sonehara .......... H01L 21/32105 |

FOREIGN PATENT DOCUMENTS

KR    1020130050589 A    5/2013

\* cited by examiner

*Primary Examiner* — Ajay Ojha
(74) *Attorney, Agent, or Firm* — William Park & Associates Ltd.

(57) ABSTRACT

A semiconductor device includes a memory block comprising a plurality of memory strings, wherein transistors, in each of the plurality of memory strings, are adjusted to be dummy transistors and normal transistors.

21 Claims, 16 Drawing Sheets

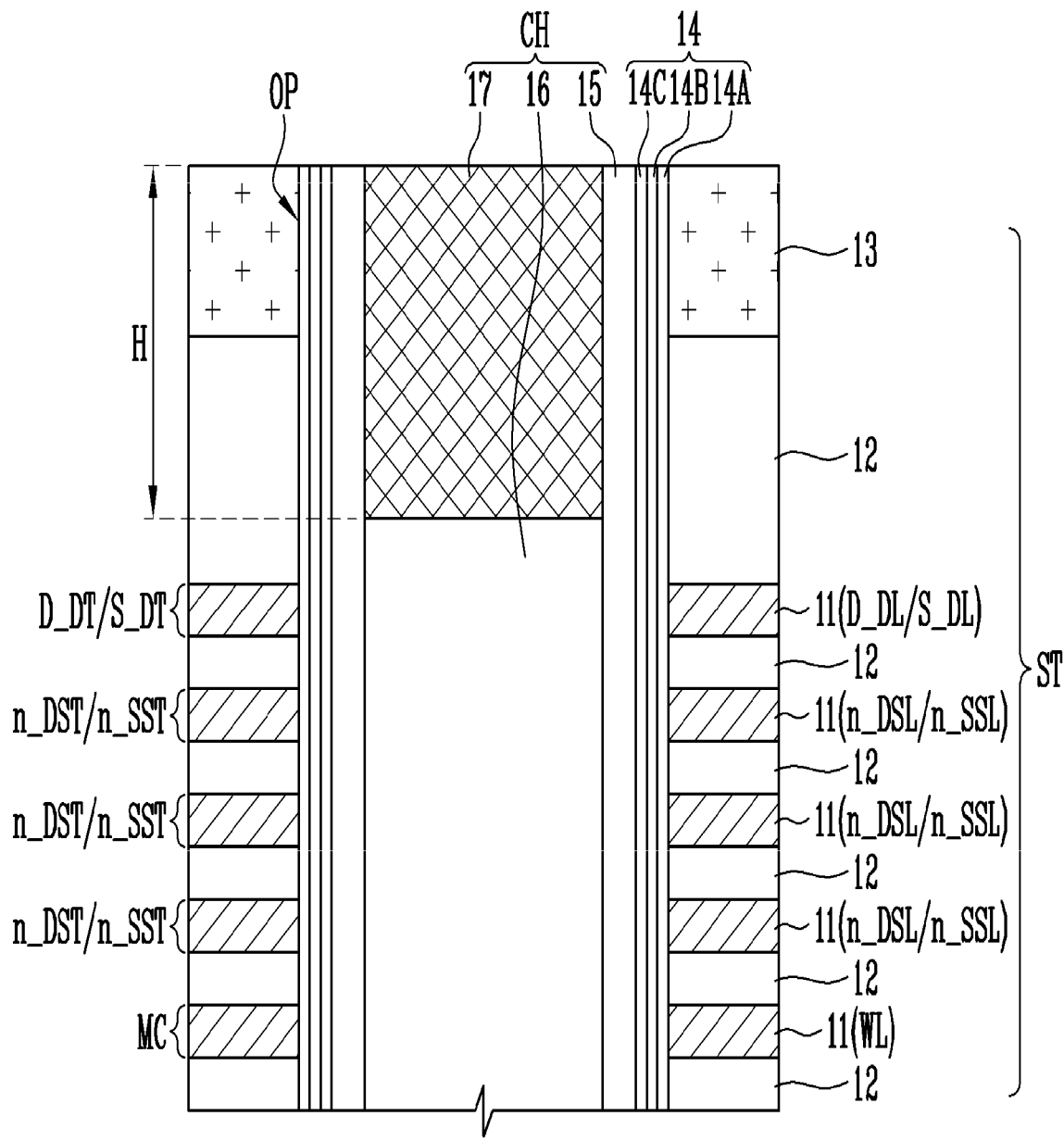

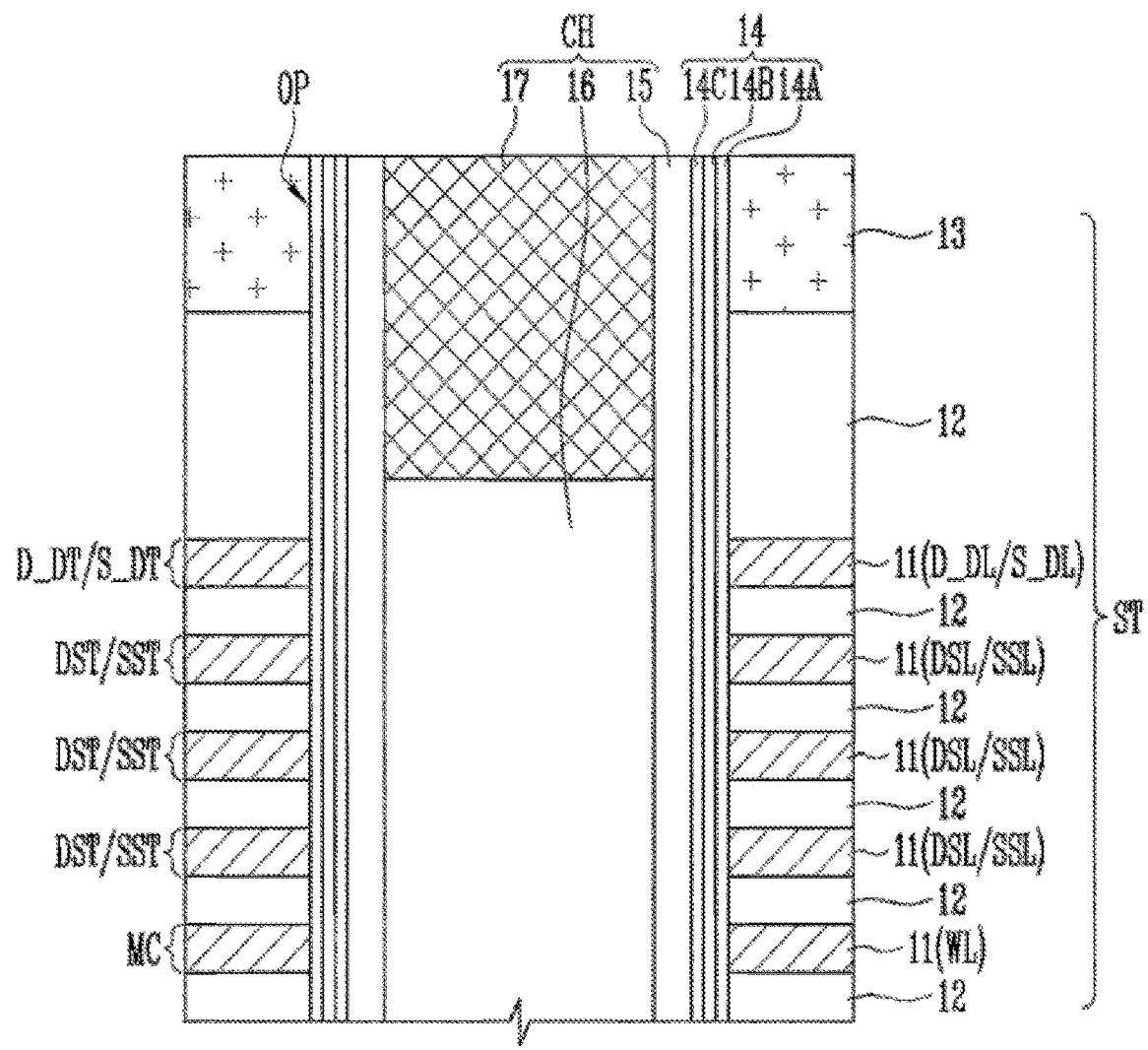

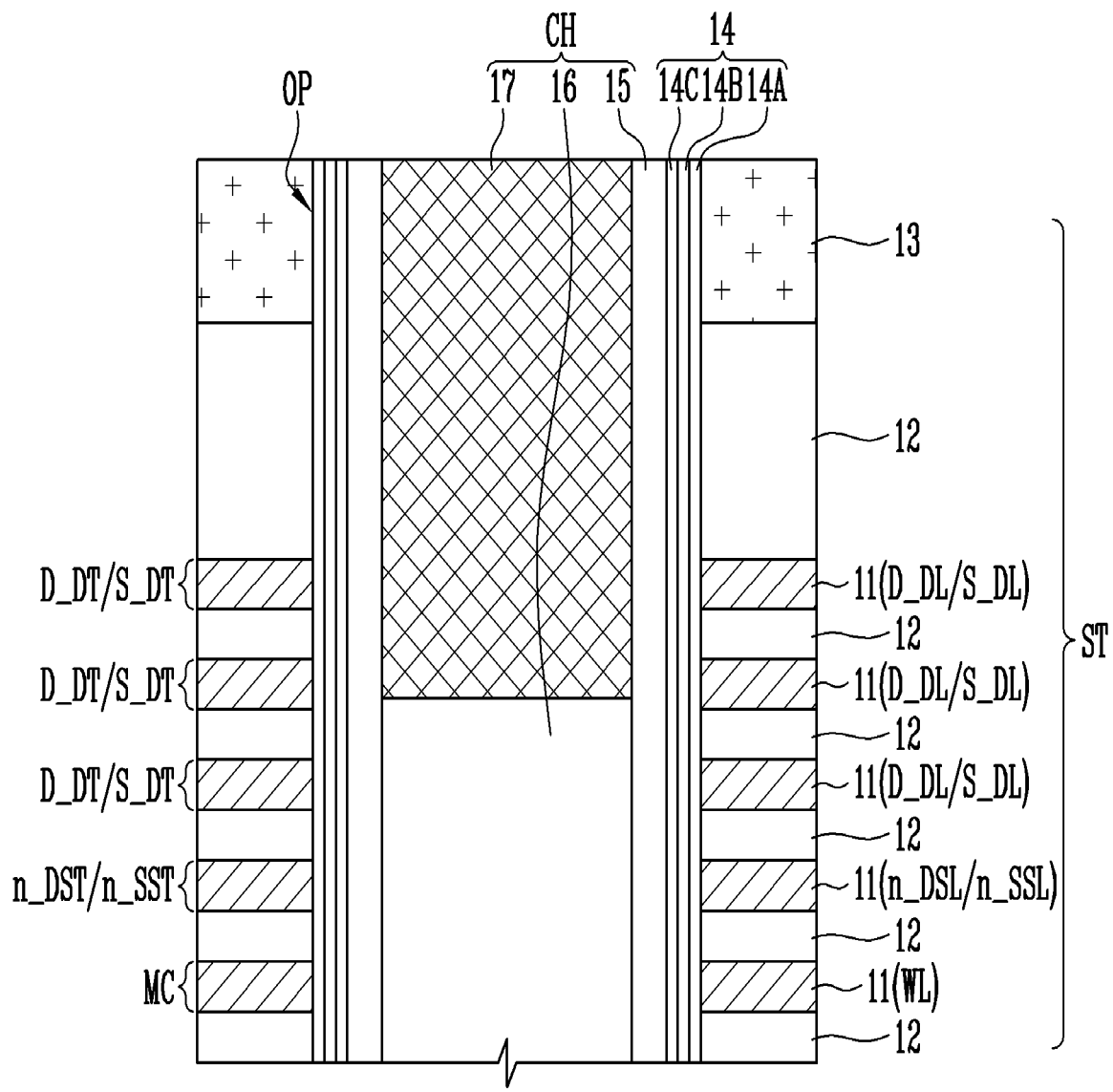

THREE-DIMENSIONAL NON-VOLATILE MEMORY DEVICE AND METHOD OF MANUFACTURING THE SAME

The present application claims priority under 35 U.S.C. § 119(a) to Korean patent application number 10-2019-0017445, filed on Feb. 14, 2019, the entire disclosure of which is incorporated herein by reference in its entirety.

BACKGROUND

1. Technical Field

The present disclosure generally relates to a non-volatile memory device and a method of manufacturing the same, and more particularly, to a non-volatile memory device having improved operational characteristics and a method of manufacturing the non-volatile memory device.

2. Related Art

A semiconductor memory device is a storage device implemented using a semiconductor such as silicon (Si), germanium (Ge), gallium arsenide (GaAs), or indium phosphide (InP). The semiconductor memory device may be generally classified into a volatile memory device and a nonvolatile memory device.

The volatile memory device is a memory device in which stored data disappears when the supply of power is interrupted. Examples of the volatile memory device include a Static Random Access Memory (SRAM), a Dynamic RAM (DRAM), a Synchronous DRAM (SDRAM), and the like. The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally classified into a NOR type flash memory and a NAND type flash memory.

During the manufacturing phase of the nonvolatile memory, the etching process may not be perfectly uniform, resulting in the varying heights of the pad. Furthermore, the diffusion of impurities from the pad to the channel layer results in differences in junction overlap. The differences in pad heights and junction overlap between memory strings lead to operational inefficiencies.

SUMMARY

In accordance with an aspect of the present disclosure, there is provided a semiconductor device including a memory block comprising a plurality of memory strings, wherein transistors, in each of the plurality of memory strings, are adjusted to be dummy transistors and normal transistors.

In accordance with another aspect of the present disclosure, there is provided a semiconductor device including a first memory string; a second memory string, wherein the first memory string comprises b first drain-side dummy transistors and the second memory string comprises c second drain-side dummy transistors, and wherein b and c are different integers of 0 or more.

In accordance with still another aspect of the present disclosure, there is provided a method of manufacturing a semiconductor device, the method including: forming a stack structure; forming openings penetrating the stack structure; forming channel layers respectively in the openings; and forming pads connected to the channel layers in the openings, wherein the number of dummy transistors is adjusted based on a height of the pads.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A and 5B are sectional views illustrating structures of the semiconductor device in accordance with embodiments of the present disclosure.

FIGS. 7A and 7B are sectional views illustrating a method of adjusting a number of dummy transistors of the semiconductor device in accordance with an embodiment of the present disclosure.

DETAILED DESCRIPTION

Embodiments provide a semiconductor device having improved operational characteristics and a manufacturing method of the semiconductor device.

Hereinafter, embodiments in accordance with the present disclosure will be described in detail with reference to the accompanying drawings.

In the following description, it should be noted that only a portion required to understand the operation in accordance with the present disclosure will be described, and the description of the remaining portion will be omitted to prevent from obscuring the gist of the present disclosure. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
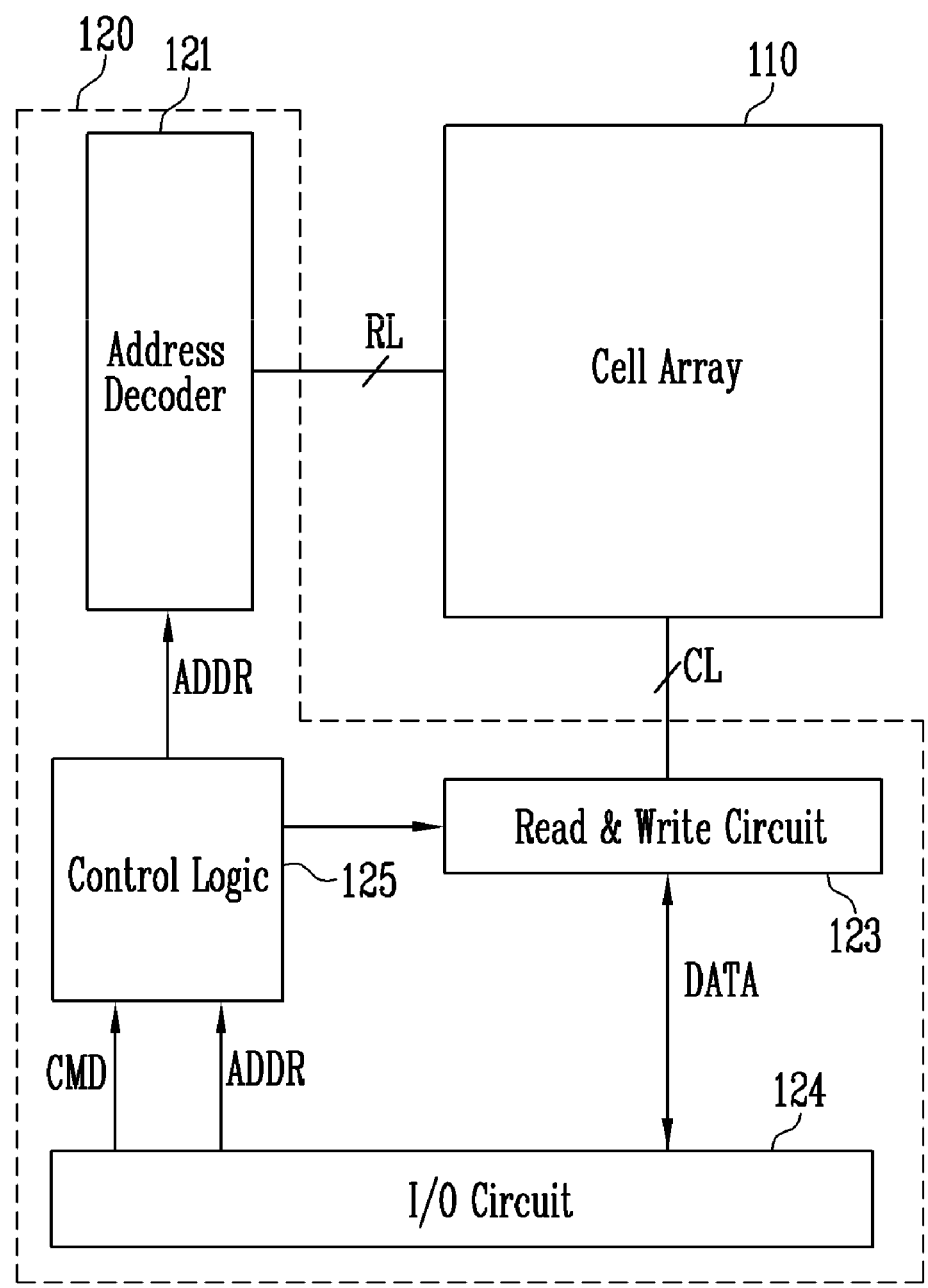
FIG. 1 is a block diagram, illustrating a configuration of a semiconductor device, in accordance with an embodiment of the present disclosure.

FIG. 1 is a block diagram, illustrating a configuration of a semiconductor device, in accordance with an embodiment of the present disclosure.

Referring to FIG. 1, the semiconductor device 100 includes a cell array 110 and a peripheral circuit 120.

The cell array 110 includes a plurality of memory strings, and the memory strings may be arranged in a horizontal direction or a vertical direction on a substrate. Furthermore, the cell array 110 includes a plurality of memory blocks, each of the memory blocks including a plurality of pages. For example, the semiconductor device 100 performs an erase operation in units of memory blocks, and performs a program operation or read operation in units of pages.

The cell array 110 is connected to an address decoder 121 through row lines RL. The cell array 110 is also connected to a read & write circuit 123 through column lines CL. The row lines RL may be word lines, and the column lines CL may be bit lines. However, the word lines and the bit lines are relative concepts. In other words, the row lines may be bit lines and the column lines may be word lines.

The peripheral circuit 120 may include the address decoder 121, the read & write circuit 123, an input/output (I/O) circuit 124, and a control logic 125.

The control logic 125 may be connected to the address decoder 121, the read & write circuit 123, and the I/O circuit 124. The control logic 125 may receive a command CMD and an address ADDR from the I/O circuit 124. Based on the received command CMD, the control logic 125 controls the address decoder 121 and the read & write circuit 123 to perform an internal operation.

The address decoder 121 may be connected to the cell array 110 through the row lines RL. The address decoder 121 may be connected to the cell array 110 through a word line, a dummy word line, a source select line, and a drain select line. Furthermore, based on the control logic 125, the address decoder 121 may be configured to control the row lines RL. In other words, as the address decoder 121 receives an address ADDR from the control logic 125, the address decoder 121 may decode the address ADDR and may select any one of the memory blocks of the cell array 110 based on the received address ADDR.

As previously stated, the program and read operations of the semiconductor device 100 may be performed in units of pages. Therefore, for program and read operations, the address ADDR may include a block address and a row address, specifying which page is to be selected. The address decoder 121 may decode the block address in the received address ADDR, and select the corresponding memory block based on the decoded block address. The address decoder 121 may also decode the row address in the received address ADDR and select the corresponding page of the selected memory block based on the decoded row address.

Furthermore, an erase operation of the semiconductor device 100 may be performed in units of memory blocks. Therefore, in the erase operation, the address ADDR includes a block address. The address decoder 121 may decode the block address and select the corresponding memory block based on the decoded block address.

The read & write circuit 123 may be connected to the memory cell array 110 through the column lines CL. When the Control Logic 125 provides the signal to perform a program operation, the read & write circuit 123 transfers data DATA, received from the I/O circuit 124, to the column lines CL, and memory cells of a selected page, selected based on Address ADDR, are programmed based on the transferred data DATA. The data DATA may be multi-bit data. In addition, the memory cells may be programmed using a Single level Cell (SLC) scheme or a Multi-Level Cell (MLC) scheme.

When the Control Logic 125 provides the signal to perform a read operation, the read & write circuit 123 reads data DATA from memory cells of a selected page, selected based on Address ADDR, through the column lines CL, and outputs the read data DATA to the I/O circuit 124.

Furthermore, when the Control Logic 125 provides the signal to perform a erase operation, the read & write circuit 123 may float the column lines CL. A verify operation may be included in the program operation and the erase operation, verifying how successful the program and erase operations were. The verify operation may be performed in a manner similar to that of the read operation.

FIGS. 2A to 2F are circuit diagrams, illustrating memory strings of the semiconductor device, in accordance with embodiments of the present disclosure.

Referring to FIGS. 2A to 2D, a memory string MS is connected between a bit line BL and a source line SL. The memory string MS may include a plurality of drain select transistors DST, a plurality of memory cells MC, and a plurality of source select transistors SST. The plurality of drain select transistors DST, the plurality of memory cells MC, and the plurality of source select transistors SST may be connected in series. The number of the drain select transistors DST in the memory string MS and the number of the source select transistors SST in the memory string MS may be equal to or different from each other. In the memory string, there may be 2 or more drain select transistors DST and 2 or more source select transistors SST.

Each of a plurality of drain select transistors DST, included in one memory string, may be a drain-side dummy transistor D_DT or a normal drain select transistor n_DST. For example, a transistor, on the drain side, having a threshold voltage that is less than a reference value, may be a drain-side dummy transistor D_DT. In turn, each of the other transistors, on the drain side, may be a normal drain select transistor n_DST. Similarly, each of a plurality of drain select lines DSL may be a drain-side dummy line D_DL or a normal drain select line n_DSL based on the threshold voltages.

The "reference value" means a value desired in design, and may be a specific numerical value or have a predetermined numerical range. The word "predetermined" as used herein with respect to a parameter, such as a predetermined numerical range, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm. A threshold voltage at which a transistor is appropriately driven as a select transistor in an erase, program or read operation may be set to the reference value.

In a similar fashion, each of a plurality of source select transistors SST, included in one memory string, may be a source-side dummy transistor S_DT or a normal source select transistor n_SST. For example, a transistor, on the source side, having a threshold voltage that is less than the reference value, may be a source-side dummy transistor S_DT. In turn, each of the other transistors, on the source side, may be a normal source select transistor n_SST. Similarly, each of a plurality of source select lines SSL may be a source-side dummy line S_DL or a normal source select line based on the threshold voltages.

Figure 2A:
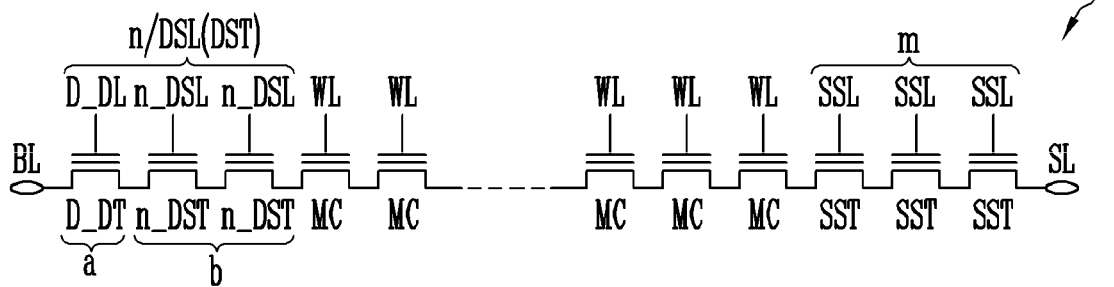
FIGS. 2A to 2F are circuit diagrams illustrating memory strings of the semiconductor device in accordance with embodiments of the present disclosure.

Referring to FIG. 2A, the n drain select transistors DST may include "a" drain-side dummy transistors D_DT and "b" normal drain select transistors n_DST. The drain-side dummy transistors D_DT may be located between the bit line BL and the normal drain select transistors n_DST. Here, "a" may be an integer of 0 or more, "b" may be an integer of 1 or more, and "a"+"b"=n may be satisfied. The memory string MS may include a dummy transistor only at a drain side, resulting in an asymmetric structure.

Figure 2B:
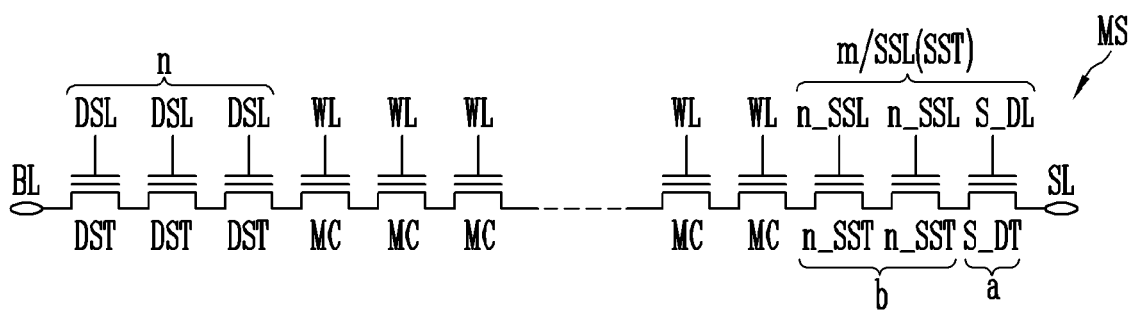

Referring to FIG. 2B, the m source select transistors SST may include "a" source-side dummy transistors S_DT and "b" normal source select transistors n_SST. The source-side dummy transistors S_DT may be located between the source line SL and the normal source select transistors n_SST. Here, "a" may be an integer of 0 or more, "b" may be an integer of 1 or more, and "a"+"b"=m may be satisfied. The memory string MS may include a dummy transistor only at a source side, resulting in an asymmetric structure.

Figure 2C:
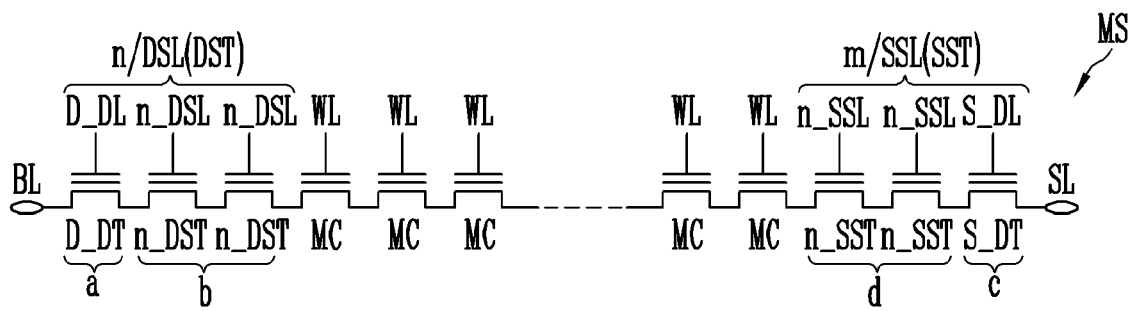

Referring to FIG. 2C, in the memory string MS, the number of drain-side dummy transistors D_DT (a) may be equal to the number of source-side dummy transistors S_DT (c). Furthermore, in the memory string MS, the number of normal drain select transistors n_DST (b) may be equal to the number of normal source select transistors n_SST (d). In addition, the total number of drain select transistors DST, (a)+(b), may be equal to the total number of source select transistors SST, (c)+(d), resulting in a symmetric structure.

Figure 2D:
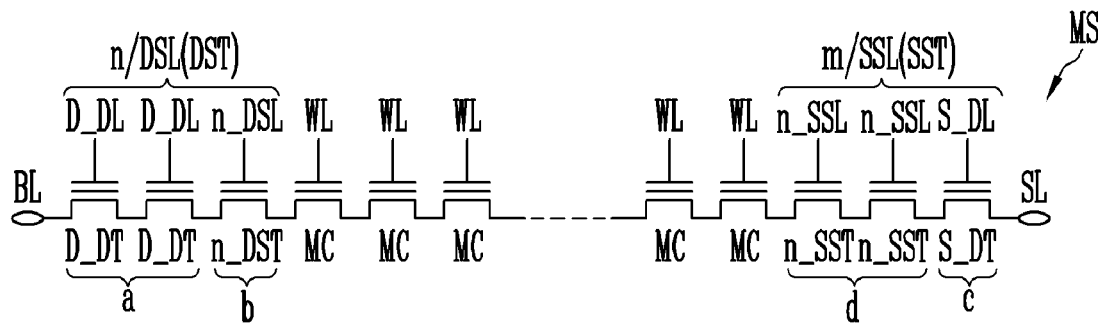

Referring to FIG. 2D, in the memory string MS, the number of drain-side dummy transistors D_DT (a) may be different than the number of source-side dummy transistors S_DT (c). Furthermore, in the memory string MS, the number of normal drain select transistors n_DST (b) may be equal to or different than the number of normal source select transistors n_SST (d). In addition, the total number of drain select transistors DST, (a)+(b), may be equal to or different than the total number of source select transistors SST, (c)+(d). In other words, the memory string may include a different number of dummy transistors at the source side and the drain side, while having the same number of normal select transistors at both the source side and the drain side, resulting in an asymmetric structure. Conversely, the memory string may include a different number of dummy transistors at the source side and the drain side, while having a different number of select transistors, which may result in a symmetric structure.

Referring to FIGS. 2A-2F, a gate electrode of a memory cell MC is connected to a word line WL. Word line voltages (e.g., a program voltage, a pass voltage, a read voltage, etc.), necessary for driving, may be applied to the word line WL. A gate electrode of a drain-side dummy transistor D_DT is connected to a drain-side dummy line D_DL. A gate electrode of a source-side dummy transistor S_DT is connected to a source side dummy line S_DL. Voltages (e.g., a program voltage, a pass voltage, a read voltage, a ground voltage, etc.), necessary for driving, may be applied to each of the dummy lines D_DL and S_DL. A gate electrode of a normal drain select transistor n_DST is connected to a normal drain select line n_DSL. A gate electrode of a normal source select transistor n_SST is connected to a normal source select line n_SSL. Similarly, voltages (e.g., a program voltage, a pass voltage, a read voltage, a ground voltage, etc.), necessary for driving, may be applied to each of the normal drain select lines D_DL and normal source select lines S_DL.

Based on the structure described above, the drain-side dummy transistor D_DT may be located between the bit line BL and the drain select transistor DST. By being located between the bit line BL and the drain select transistor DST, the drain-side dummy transistor D_DT can serve as a buffer when the normal drain select transistor n_DST controls the connection between the memory string MS and the bit line BL.

The source-side dummy transistor S_DT may be located between the source line SL and the source select transistor SST. By being located between the source line SL and the source select transistor SST, the source-side dummy transistor S_DT can serve as a buffer when the normal source select transistor n_SST controls the connection between the memory string MS and the source line SL.

Figure 2E:
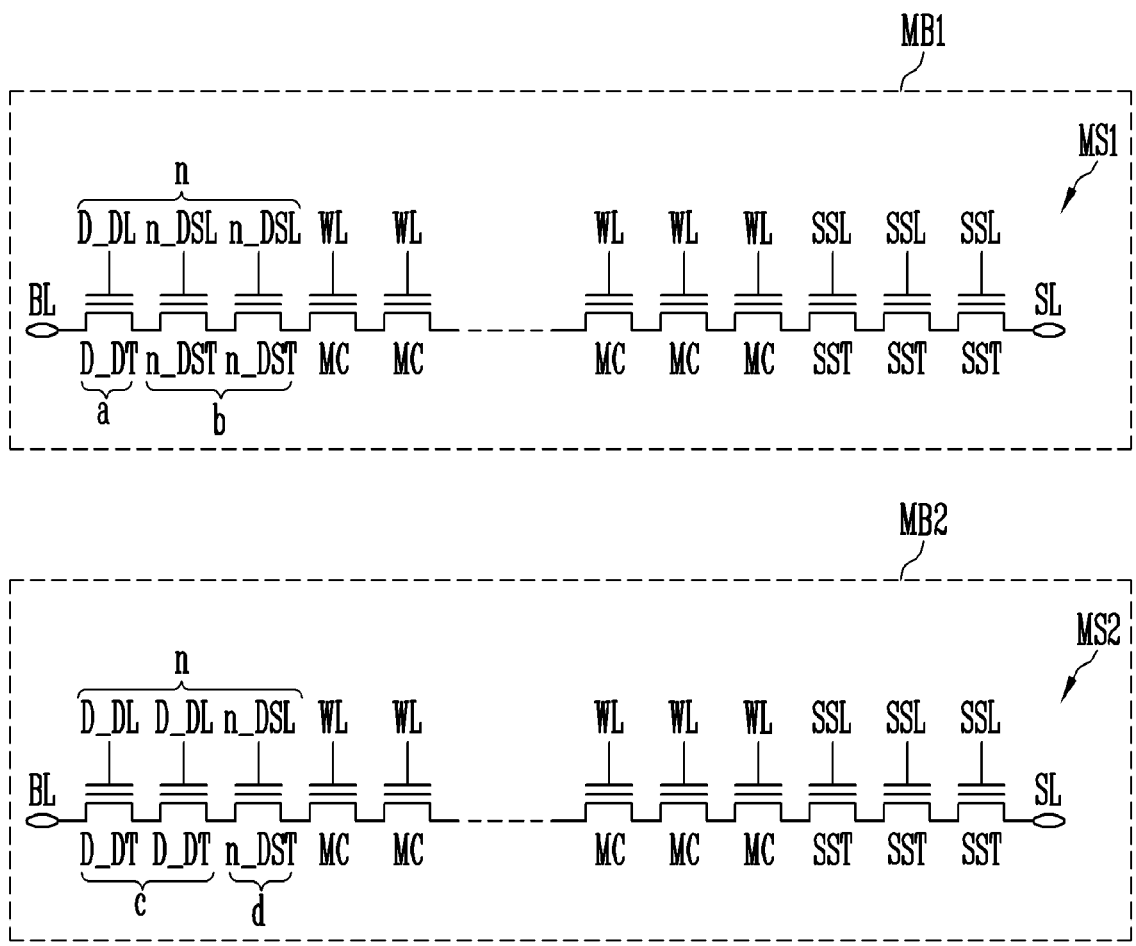
Figure 2F:
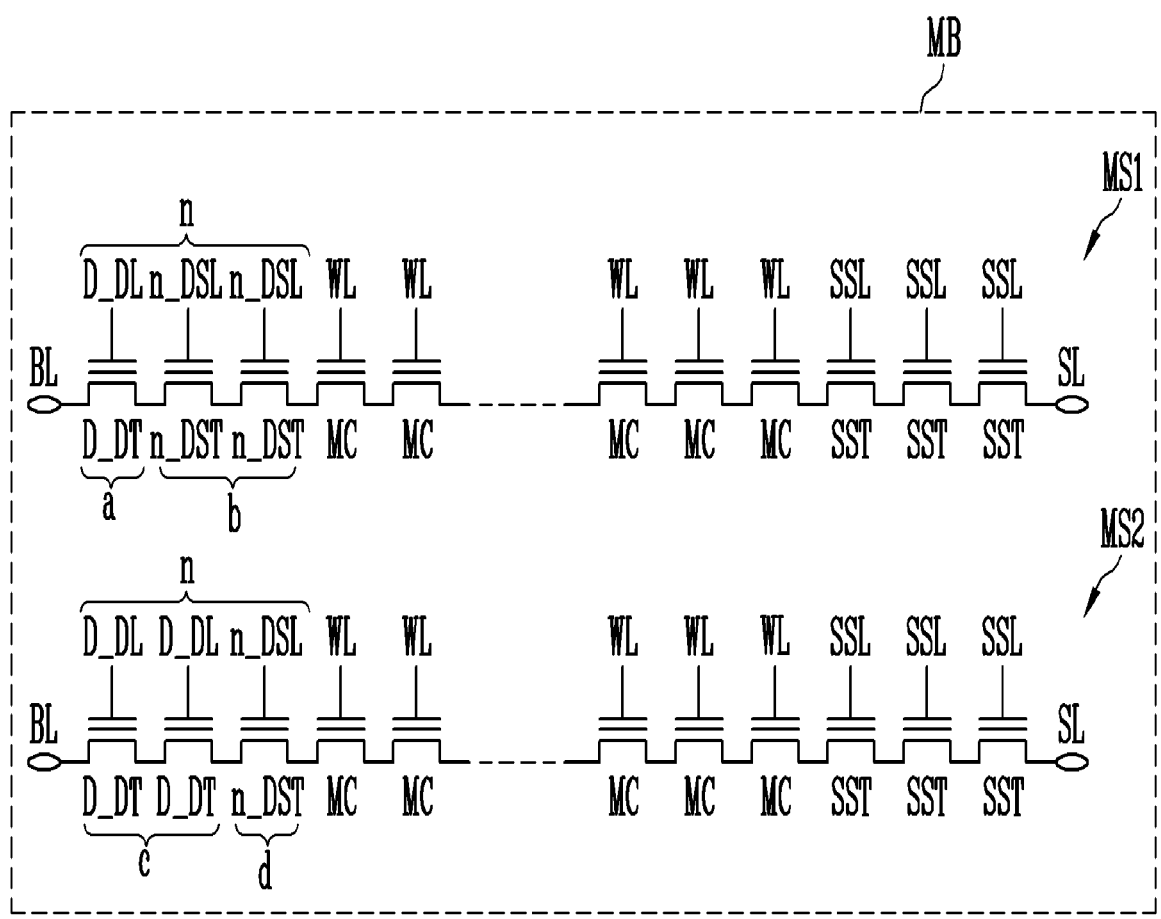

To preface FIGS. 2E-2F, a cell array may include a plurality of memory blocks, and each memory block may include a plurality of memory strings MS. The memory strings MS may have different physical structures, such as a height of a pad of each memory string MS and a junction overlap of a channel structure.

Figure 5B:
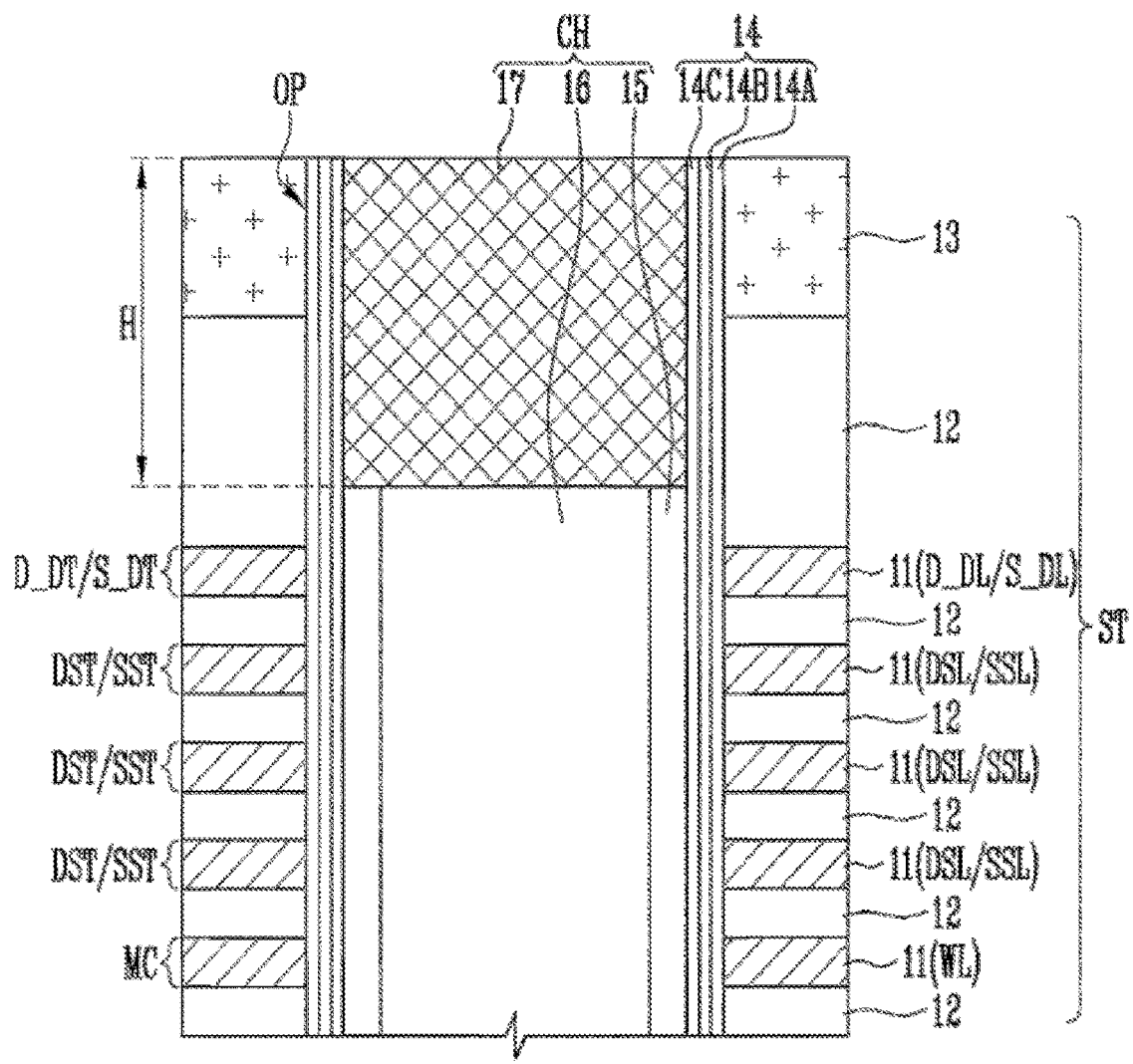

Referring briefly to FIG. 5A, the height (H) of the pad 17 is illustrated. Furthermore, the junction overlap of the memory string may be the height H of the pad 17, along with the region in which the impurity in pad 17 is diffused into the channel layer 15, the components of which will be described in greater detail in regard to FIGS. 5A-5B.

In addition, the physical structural differences of junction overlap and pad height may cause electrical differences, resulting in the different threshold voltages of the transistors. For example, a memory string may include too many select transistors, each having a threshold voltage that is less than the reference value, based on the height of the pad or the junction overlap being greater than the reference value, and not enough dummy transistors. Therefore, in order to minimize the difference in electrical and physical characteristics, an embodiment adjusts a number of dummy transistors based on the threshold voltages, pad height, and junction overlap.

In the embodiment, some of a predetermined number of select transistors are set as dummy transistors, and the other select transistors are set as normal select transistors based on threshold voltages of the select transistors, a junction overlap of a memory string, a height of a pad, etc. For example, referring to FIGS. 2E-2F, "a" drain select transistors, among "n" drain select transistors DST, included in the memory string MS, may be set as drain-side dummy transistors D_DT based on the physical structure of a memory string MS. Since the number "n" of the drain select transistors DST, included in the memory string MS, is predetermined, "b" ("n"–"a"="b") normal drain select transistors n_DST is determined based on the number of drain-side dummy transistors D_DT that are set. In addition to "n" being predetermined, "n" is the same for each of a plurality of memory strings MS. In other words, the same number (n) of drain select transistors DST is included in each of the plurality of memory strings MS. Therefore, as the number of the drain-side dummy transistors D_DT increases, the number of the normal drain select transistors n_DST decreases, and vice-versa. Accordingly, the number of dummy transistors and normal select transistors can be flexibly adjusted based on a physical structure of each of the memory strings based on the predetermined number and the same number of select transistors in each of the memory strings.

FIG. 2E illustrates a case where the number of dummy transistors in the memory strings are adjusted in units of memory blocks, and FIG. 2F illustrates a case where the number of dummy transistors in the memory strings are adjusted in units of memory strings.

Referring to FIGS. 2E and 2F, a first memory string MS1 includes "a" drain-side dummy transistors D_DT and "b" normal drain select transistors n_DST. A second memory string MS2 includes "c" drain-side dummy transistors D_DT and "d" normal drain select transistors n_DST. In addition, the total number of the first drain-side dummy transistors and first normal drain select transistors ("a"+"b") may be equal to the total number of second drain-side dummy transistors and the second normal drain select transistors ("c"+"d"). Here, "a" and "c" may be integers of 0 or more, and "b" and "d" may be integers of 1 or more.

The first memory string MS1 and the second memory string MS2 may have different physical structures, and accordingly, the number of the first drain-side dummy transistors "a" may be different from the number of the second drain-side dummy transistors "c" (a≠c). This may be occur when the second memory string MS2 has a junction overlap greater than that of the first memory string MS1. In such a case, the number of the second drain-side dummy transistors "c" is greater than the number of the first drain-side dummy transistors "a" ("c">"a").

Referring to FIG. 2E, a first memory block MB1 includes a plurality of first memory strings MS1, and a second memory block MB2 includes a plurality of second memory strings MS2. Therefore, the number of dummy transistors may be adjusted in units of memory blocks. On the other hand, referring to FIG. 2F, memory block MB includes both the first memory string MS1 and the second memory string MS2. Therefore, numbers of dummy transistors may be adjusted in units of memory strings.

Although FIGS. 2E and 2F illustrate a case where each of the first and second memory strings MS1 and MS2 has a structure similar to that shown in FIG. 2A, this is merely an example for convenience of description, and the present disclosure is not limited thereto. Each of the first and second memory strings MS1 and MS2 may have a structure similar to the structures shown in FIGS. 2A to 2D or a combination of the structures thereof. In other words, each of the first and second memory strings MS1 and MS2 may include a dummy transistor only at a drain side (FIG. 2A), only at a source side (FIG. 2B), or at both the drain side and the source side (FIGS. 2C-2D).

Besides adjusting the number of dummy transistors, another method is to have the control logic 125 control the address decoder 121 and the read & write circuit 123, such that the bias applied to a dummy line is different from the bias applied to a select line when performing an erase operation, a program operation, or a read operation. This method will be further hashed out in regard to FIG. 3. Alternatively, another method is to have the semiconductor device programmed in the manufacturing process such that dummy transistors have a uniform threshold voltage. By doing so, the memory strings may have uniform operating characteristics despite having different physical structures.

Figure 3:
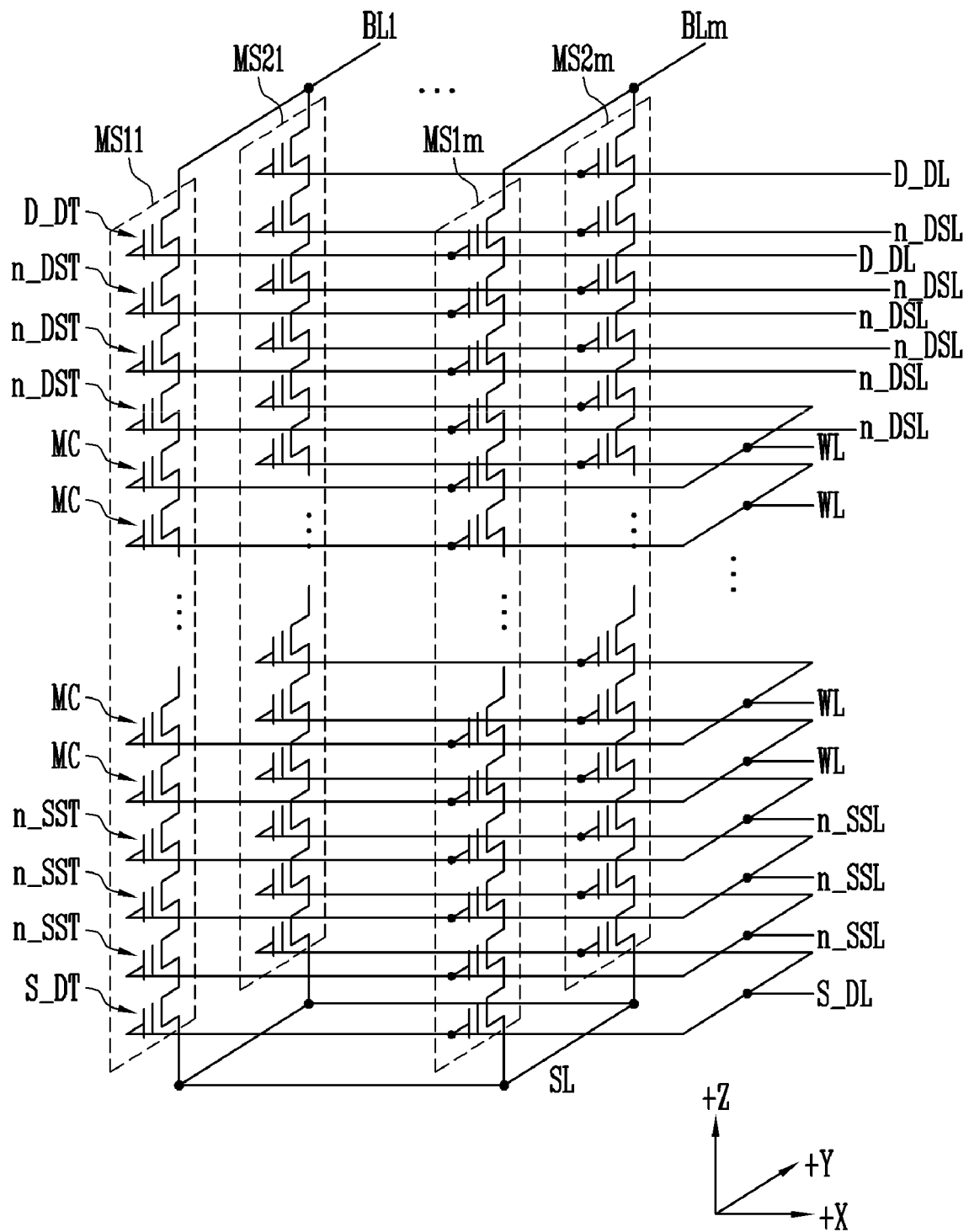
FIG. 3 is a diagram illustrating a memory block of a cell array of the semiconductor device in accordance with an embodiment of the present disclosure.

FIG. 3 is a diagram, illustrating a memory block of a cell array of the semiconductor device, in accordance with an embodiment of the present disclosure. The cell array may include a plurality of memory blocks BLK, and each memory block BLK may include three-dimensionally arranged memory cells MC.

Referring to FIG. 3, a memory block BLK includes a plurality of memory strings MS11 to MS1$m$ and MS21 to MS2$m$ connected between bit lines BL1 to BLm and a source line SL. Each of the memory strings MS11 to MS1$m$ and MS21 to MS2$m$ may extend along a +Z direction. In other words, the +Z direction may be a direction in which memory cells MC are stacked. In turn, the +Y direction may be a direction in which the bit lines BL1 to BLm extend, and the +X direction may be a direction in which the word lines WL extend. Here, m is an integer of 2 or more.

Each of the memory strings MS11 to MS1$m$ and MS21 to MS2$m$ includes at least one normal source select transistor n_SST, a plurality of memory cells MC, and at least one normal drain select transistor n_DST, which are sequentially stacked. Furthermore, in an embodiment, each of the memory strings MS11 to MS1$m$ and MS21 to MS2$m$ may further include at least one drain-side dummy transistor D_DT, at least one source-side dummy transistor S_DT, or at least one of each. However, the number of dummy transistors D_DT and S_DT, included in each of the memory strings MS11 to MS1$m$ and MS21 to MS2$m$, may be changed. For example, the number of drain-side dummy transistors D_DT, included in a memory string, may be equal to or different than the number of source-side dummy transistors S_DT, included in the memory string. Furthermore, each of the memory strings MS11 to MS1$m$ and MS21 to MS2$m$ may include a different number of dummy transistors D_DT and S_DT.

The source-side dummy transistor S_DT may be connected in series between the normal source select transistor n_SST and the source line SL. The source-side dummy transistors S_DT, located at the same level, may be connected to the same source-side dummy line S_DL.

Likewise, the drain-side dummy transistor D_DT may be connected in series between the normal drain select transistor n_DST and a bit line BL. In addition, drain-side dummy transistors D_DT, located at the same level and arranged on the same row in the +X direction, may be connected to the same drain-side dummy line D_DL. Therefore, drain-side dummy transistors D_DT, located at the same level, but arranged on a different row in the +X direction, may be connected to a different drain-side dummy line D_DL.

The memory cells MC may be connected in series between the normal source select transistor n_SST and the normal drain select transistor n_DST. In addition, memory cells MC, located at the same level, may be connected to the same word line WL.

The normal source select transistors n_SST may be connected in series between the source-side dummy transistor S_DT and the memory cells MC. In addition, the normal source select transistors n_SST, located at the same level, may be connected to the same source select line SSL.

Likewise, the normal drain select transistors n_DST may be connected in series between the drain-side dummy transistor D_DT and the memory cells MC. In addition, normal drain select transistors n_DST, located at the same level and arranged on the same row in the +X direction, may be connected to the same normal drain select line n_DSL. Therefore, normal drain select transistors n_DST, located at the same level, but arranged on a different row in the +X direction, may be connected to a different normal drain select line n_DSL.

The total number of drain-side dummy transistors D_DT and normal drain select transistors n_DST (D_DT+n_DST) may be the same in each of the memory strings MS11 to MS1$m$ and MS21 to MS2$m$. However, the number of drain-side dummy transistors D_DT in the respective memory strings MS11 to MS1$m$ and MS21 to MS2$m$ may be different from one another. In turn, the number of normal drain select transistors n_DST in the respective memory strings MS11 to MS1$m$ and MS21 to MS2$m$ may be different from one another.

Likewise, the total number of source-side dummy transistors D_DT and normal source select transistors n_SST (S_DT+n_SST) may be the same in each of the memory strings MS11 to MS1$m$ and MS21 to MS2$m$. However, the number of source-side dummy transistors S_DT in the respective memory strings MS11 to MS1$m$ and MS21 to MS2$m$ may be different from each other. In turn, the number of normal source select transistors n_SST in the respective memory strings MS11 to MS1$m$ and MS21 to MS2$m$ may be different from one another.

As discussed before, another method to minimizing characteristic differences, based on a physical structure of a memory string, may be to apply a bias to a dummy line that is different from a bias applied to a select line when performing an erase operation, a program operation, or a read operation.

Table 1 illustrates conditions of a bias level used in an erase operation of the cell array described with reference to FIG. 3.

TABLE 1

|  | GIDL/Erase operation | Erase operation |
|---|---|---|
| BL | Floating (−Vsource) | |
| D_DL | 0 V ± α | Floating (Vers − $V_{GIDL}$) |
| n_DSL | 0 V | Floating (Vers − $V_{GIDL}$) |
| WL | Floating/Vpass/0 V | 0 V |
| n_SSL | 0 V | Floating (Vers − $V_{GIDL}$) |
| S_DL | 0 V ± α | Floating (Vers − $V_{GIDL}$) |
| SL | $V_{GIDL}$ | Vers (20 V) |

The erase operation may be performed using a Gate Induced Drain Leakage (GIDL) method. For example, the erase operation may be performed by generating a GIDL current, using a GIDL voltage $V_{GIDL}$ and then injecting holes into a data storage layer of the memory cells.

First, the GIDL voltage $V_{GIDL}$ is applied to the source line SL, and a ground voltage (0V) is applied to the normal drain select line n_DSL and the normal source select line n_SSL. A negative voltage can also be applied to the normal drain select line n_DSL and the normal source select line n_SSL. Furthermore, a pass voltage may be applied to the word lines WL, the ground voltage (0V) may be applied to the word lines WL, or the word lines may be floated. Additionally, the bit line BL may be floated, and the potential of the bit line BL may be increased up to a source voltage Vsource by coupling. In addition, a bias voltage may be applied to the dummy line D_DL/S_DL. The bias voltage may have a different voltage level from the bias voltage applied to the normal select line n_DSL/n_SSL. Subsequently, the potential level of the source line SL is increased to an erase voltage Vers, and the normal drain select line n_DSL, the normal source select line n_SSL, and the dummy line D_DL/S_DL are floated by coupling. The potentials of the normal drain select line n_DSL, the normal source select line n_SSL, and the dummy line D_SL/S_DL may be increased up to Vers−$V_{GIDL}$. The erase voltage Vers may be applied to the bit line BL.

In the GIDL method, the bias applied to the dummy line D_DL/S_DL may be calculated by applying a positive or negative offset to the bias applied to the normal select line n_DSL/nSSL. For example, when the height of the pad or the junction overlap is greater than or equal to a reference value, a bias with a negative offset (−α) may be applied to the dummy line D_DL/S_DL. Similarly, when a threshold voltage of a dummy transistor is less than or equal to a reference value, the bias with the negative offset (−α) may be applied to the dummy line D_DL/S_DL. Accordingly, a transient amount of GIDL current can be decreased or a Band-to-Band Tunneling (BTBT) current can be decreased by forming a depletion region in a junction. On the other hand, when the height of the pad or the junction overlap is smaller than the reference value, a bias with a positive offset (+α) may be applied to the dummy line D_DL/S_DL. Similarly, when a threshold voltage of a dummy transistor is greater than a reference value, the bias with the positive offset (+α) may be applied to the dummy line D_DL/S_DL. Accordingly, an insufficient amount of GIDL current may be increased.

Table 2 illustrates conditions of a bias level used in a program operation of the cell array described with reference to FIG. 3.

TABLE 2

|  | Program operation (selection) | Program operation (non-selection) |
|---|---|---|
| BL | 0 V | $V_{DD}$ (2.3 V) |
| D_DL | Von ± α | Voff ± α |
| n_DSL | Von (2.3 V) | Voff (0 V) |
| WL | Vpgm (20 V) | Vpass (8 V) |
| n_SSL | Voff (0 V) | Voff (0 V) |
| S_DL | Voff ± α | Voff ± α |
| SL | $V_{DD}$ (2.3 V) | |

In the program operation, a program allow voltage (0V) is applied to a selected bit line BL, and a program inhibit voltage is applied to an unselected bit line BL. The program inhibit voltage may be a power voltage $V_{DD}$. The normal drain select transistor n_DST is turned on by applying a turn-on voltage Von to a selected normal drain select line n_DSL, while the normal drain select transistor n_DST is turned off by applying a turn-off voltage Voff to an unselected normal drain select line n_DSL. A program voltage Vpgm is applied to a selected word line WL, while a pass voltage Vpass is applied to an unselected word line WL. The power voltage $V_{DD}$ is applied to the source line SL, and the normal source select transistor n_SST is turned off by applying the turn-off voltage Voff to the normal source select line n_SSL. In addition, a bias voltage may be applied to the dummy line D_DL/S_DL. The bias voltage may have a different voltage level from the bias voltage applied to the normal select line n_DSL/n_SSL.

As in Table 1, the bias applied to the dummy line D_DL/S_DL may be calculated by applying a positive or negative offset to the bias applied to the normal select line n_DSL/nSSL. For example, when the height of the pad or the junction overlap is greater than or equal to a reference value, a bias with a negative offset (−α) may be applied to the dummy line D_DL/S_DL. Similarly, when a threshold voltage of a dummy transistor is less than or equal to a reference value, the bias with the negative offset (−α) may be applied to the dummy line D_DL/S_DL. Accordingly, leakage current can be decreased. On the other hand, when the height of the pad or the junction overlap is smaller than the reference value, a bias with a positive offset (+α) may be applied to the dummy line D_DL/S_DL. Similarly, when a threshold voltage of a dummy transistor is greater than a reference value, the bias with the positive offset (+α) may be applied to the dummy line D_DL/S_DL.

Table 3 illustrates conditions of a bias level used in a read operation of the cell array described with reference to FIG. 3.

TABLE 3

|  | Read operation (selection) | Read operation (non-selection) |
|---|---|---|
| BL | Vbl (0.5 V) | |
| D_DL | Von ± α | Voff ± α |
| n_DSL | Von | Voff |
| WL | Vread | Vpass (7 V) |
| n_SSL | Von | Voff |
| S_DL | Von ± α | Voff ± α |
| SL | 0 V | |

In the read operation, the bit line BL is charged with a bit line voltage Vbl, a turn-on voltage Von is applied to a selected normal drain select line n_DSL, and a turn-off voltage Voff is applied to an unselected normal drain select line n_DSL. A ground voltage (0V) is applied to the source line SL, the turn-on voltage Von is applied to a selected normal source select line n_SSL, and the turn-off voltage Voff is applied to an unselected normal source select line n_SSL. A read voltage Vread is applied to a selected word line WL, and a pass voltage Vpass is applied to an unselected word line WL. The pass voltage Vpass may be a voltage having a level at which a memory cell is turned on regardless of a program state of the memory cell. In addition, a bias voltage may be applied to the dummy line D_DL/S_DL. The bias voltage may have a different voltage level from the bias voltage applied to the normal select line n_DSL/n_SSL.

The bias applied to the dummy line D_DL/S_DL may be calculated by applying a positive or negative offset to the bias applied to the normal select line n_DSL/nSSL. For example, when the height of the pad or the junction overlap is greater than or equal to a reference value, a bias with a negative offset (−α) may be applied to the dummy line D_DL/S_DL. Similarly, when a threshold voltage of a dummy transistor is less than or equal to a reference value, the bias with the negative offset (−α) may be applied to the dummy line D_DL/S_DL. On the other hand, when the height of the pad or the junction overlap is smaller than the reference value, a bias with a positive offset (+α) may be applied to the dummy line D_DL/S_DL. Similarly, when a threshold voltage of a dummy transistor is greater than a reference value, the bias with the positive offset (+α) may be applied to the dummy line D_DL/S_DL.

Figure 4:
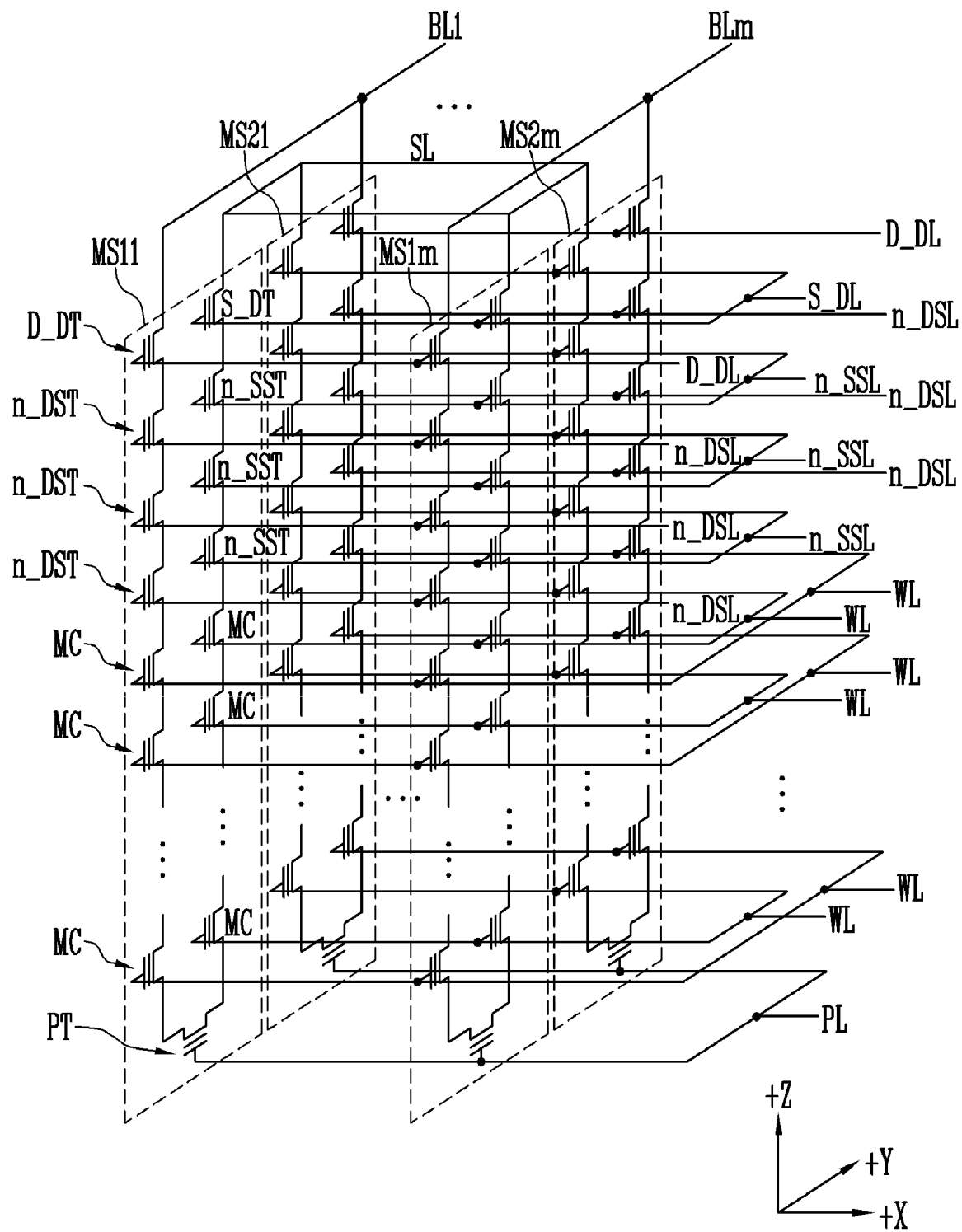
FIG. 4 is a diagram illustrating a memory block of a cell array of the semiconductor device in accordance with an embodiment of the present disclosure.

FIG. 4 is a diagram, illustrating a memory block of a cell array of the semiconductor device, in accordance with an embodiment of the present disclosure. The cell array may include a plurality of memory blocks BLK, and each memory block BLK may include three-dimensionally arranged memory cells MC.

Referring to FIG. 4, a memory block BLK includes a plurality of memory strings MS11 to MS1m and MS21 to MS2m. Each of the memory strings MS11 to MS1m and MS21 to MS2m may include at least one source-side dummy transistor S_DT, at least one normal source select transistor n_SST, a plurality of memory cells MC, at least one pipe transistor PT, a plurality of memory cells MC, at least one normal drain select transistor n_DST, and at least one drain-side dummy transistor D_DT, connected in series, respectively. Each of the memory strings MS11 to MS1m and MS21 to MS2m may be arranged in a 'U' shape, resulting in the source-side dummy transistor S_DT and normal source select transistor n_SST being located at similar levels to the drain-side dummy transistor D_DT and normal drain select transistor n_DST, respectively.

Although FIG. 4 illustrates each of the memory strings MS11 to MS1m and MS21 to MS2m having one drain-side dummy transistor D_DT and source-side dummy transistor S_DT, this is merely an example for convenience of description and the present disclosure is not limited thereto. Each of the memory strings MS11 to MS1m and MS21 to MS2m may include at least one drain-side dummy transistor D_DT, at least one source-side dummy transistor S_DT, or at least one of each. However, the number of dummy transistors D_DT and S_DT, included in each of the memory strings MS11 to MS1m and MS21 to MS2m, may be changed. For example, the number of drain-side dummy transistors D_DT, included in a memory string, may be equal to or different than the number of source-side dummy transistors S_DT, included in the memory string. Furthermore, each of the memory strings MS11 to MS1m and MS21 to MS2m may include a different number of dummy transistors D_DT and S_DT.

The source-side dummy transistor S_DT may be connected in series between the normal source select transistor n_SST and the source line SL. The source-side dummy transistors S_DT, located at the same level, may be connected to the same source-side dummy line S_DL.

Likewise, the drain-side dummy transistor D_DT may be connected in series between the normal drain select transistor n_DST and a bit line BL. In addition, drain-side dummy transistors D_DT, located at the same level and arranged on the same row in the +X direction, may be connected to the same drain-side dummy line D_DL. Therefore, drain-side dummy transistors D_DT, located at the same level, but arranged on a different row in the +X direction, may be connected to a different drain-side dummy line D_DL.

The memory cells MC may be connected in series between the normal source select transistor n_SST and the pipe transistor PT and may also be connected in series between the normal drain select transistor n_DST and the pipe transistor PT. In addition, referring to FIG. 4, memory cells MC, located at the same level and from different memory strings, may be connected to the same word line WL, the connections mirroring the X-Z plane that extends in the +X direction in between the MS11/MS1m memory strings and the MS21/MS2m memory strings.

The normal source select transistors n_SST may be connected in series between the source-side dummy transistor S_DT and the memory cells MC. In addition, the normal source select transistors n_SST, located at the same level, may be connected to the same source select line SSL.

Likewise, the normal drain select transistors n_DST may be connected in series between the drain-side dummy transistor D_DT and the memory cells MC. In addition, normal drain select transistors n_DST, located at the same level and arranged on the same row in the +X direction, may be connected to the same normal drain select line n_DSL. Therefore, normal drain select transistors n_DST, located at the same level, but arranged on a different row in the +X direction, may be connected to a different normal drain select line n_DSL.

The pipe transistor PT connects the drain-side of a memory cell MC to the source-side of another memory cell MC. The pipe transistor PT may be located at the lower-most position of the memory string in the +Z direction. In addition, the gate of the pipe transistor PT of each of the memory strings MS11 to MS1m and MS21 to MS2m may all be connected to the same pipe line PL.

The total number of drain-side dummy transistors D_DT and normal drain select transistors n_DST (D_DT+n_DST) may be the same in each of the memory strings MS11 to MS1m and MS21 to MS2m. However, the number of drain-side dummy transistors D_DT in the respective memory strings MS11 to MS1m and MS21 to MS2m may be different from one another. In turn, the number of normal drain select transistors n_DST in the respective memory strings MS11 to MS1m and MS21 to MS2m may be different from one another.

Likewise, the total number of source-side dummy transistors D_DT and normal source select transistors n_SST (S_DT+n_SST) may be the same in each of the memory strings MS11 to MS1m and MS21 to MS2m. However, the number of source-side dummy transistors S_DT in the respective memory strings MS11 to MS1m and MS21 to MS2m may be different from each other. In turn, the number of normal source select transistors n_SST in the respective memory strings MS11 to MS1m and MS21 to MS2m may be different from one another.

The operating method is similar to those described with reference to FIG. 3, and the overlapping descriptions will be omitted.

FIGS. 5A and 5B are sectional views illustrating structures of the semiconductor device in accordance with embodiments of the present disclosure.

Referring to FIGS. 5A and 5B, a stack structure ST may include conductive layers 11 and insulating layers 12, which are alternately stacked. The stack structure ST may also include a hard mask layer 13 at an uppermost portion of the stack. The hard mask layer 13 may include nitride, carbon, etc. In addition, conductive layers 11 may include polysilicon, tungsten, a metal, etc.

Each of the conductive layers 11 may be a word line WL, a normal drain select line n_DSL, a normal source select line n_SSL, a drain-side dummy line D_DL, or a source-side dummy line S_DL. For example, at least one normal select line n_DSL/n_SSL may be on the word lines WL, and at least one dummy line D_DL/S_DL may be on the normal select line n_DSL/n_SSL.

The stack structure ST may include openings, extending in a stacking direction thereof. The stacking direction is the direction in which the conductive layers 11 and the insulating layers 12 are stacked. In other words, the stacking direction is the vertical direction from the surface of a substrate (not shown).

A channel structure CH may be formed in each of the opening OP. In addition, a memory layer 14 may be interposed between the channel structure CH and the stack structure ST. The memory layer 14 may be formed to surround each of the outer sidewall of channel layer 15. Furthermore, the memory layer 14 may include at least one of a charge blocking layer 14A, a data storage layer 14B, and a tunnel insulating layer 14C. For example, the data storage layer 14B may include a floating gate, a charge trapping material, a variable resistance material, a nano-structure, etc.

Each of the channel structures CH includes a channel layer 15, a gap fill layer 16, and a pad 17. Each of the channel structures CH are formed in one opening OP. The gap fill layer 16 may be formed in the channel layer 15 so that the channel layer 15 surrounds the gap fill layer 16. The gap fill layer 16 may include an insulating material.

The pad 17 may be located on the top of the gap fill layer 16 and connected to the channel layer 15. Referring to FIG. 5A, the pad 17 may be formed in the channel layer 15 so that the channel layer 15 surrounds the pad 17, and the sidewall of the pad 17 may be in contact with the inner wall of the channel layer 15.

Referring to FIG. 5B, an upper surface of the channel layer 15 and an upper surface of the gap fill layer 16 may be located at substantially the same level, and the pad 17 may be located on the top of both the channel layer 15 and the gap fill layer 17. A lower surface of the pad 17 and the upper surface of the channel layer 15 may be in contact with one another.

The pad 17 may include a P-type impurity or an N-type impurity, having an impurity concentration higher than that of the channel layer 15. Furthermore, the channel layer 15 may include no impurities or may include an impurity at a concentration lower than that of the pad 17. For example, the pad 17 may be a polysilicon layer, doped with an N-type impurity at a high concentration, while the channel layer 15 may be an un-doped polysilicon layer or a polysilicon layer, doped with an N-type impurity at a low concentration.

Based on this structure, memory cells MC, normal select transistors n_DST/n_SST, and dummy transistors D_DT/S_DT, which are included in one memory string MS, share the channel structure CH. Specifically, the normal select transistor n_DST/n_SST is located in a region in which the channel layer 15 and the normal select line n_DSL/n_SSL intersect each other, and a dummy transistor D_DT/S_DT is located in a region in which the channel layer 15 and the dummy line D_DL/S_DL intersect each other. In other words, each memory string includes memory cells, at least one normal select transistor n_DST/n_SST, and at least one dummy transistor D_DT/S_DT, which are stacked along the channel layer 15.

Therefore, the channel layer 15 and the memory layer 14 becomes a part of the connections with the transistors. Specifically, the memory layer 14 is used as a gate insulating layer. For example, each of the memory cells MC may include the channel layer 15, the memory layer 14, and a gate electrode. In addition, each of the normal select transistor n_DST/n_SST and the dummy transistor D_DT/S_DT may have a structure similar to that of the memory cell MC. In other words, each of the normal select transistor n_DST/n_SST and the dummy transistor D_DT/S_DT may include the channel layer 15, the memory layer 14, and a gate electrode.

Since the pad 17 includes an impurity at a concentration higher than that of the channel layer 15, the pad 17 may be used as a junction of the dummy transistor D_DT/S_DT or the normal select transistor n_DST/n_SST. Furthermore, when the impurity in the pad 17 is diffused into the channel layer 15, the region in the channel layer 15, in which the impurity is diffused, along with the pad 17, serves together as the junction. Therefore, an electrical characteristic of the memory string MS or the transistor D_DT/S_DT or n_DST/n_SST may vary depending on the height H of the pad 17 of the channel structure CH or a junction overlap. As previously disclosed, the junction overlap may mean the area in which the junction is formed in the channel structure CH. That is, the junction overlap may mean a height H of the pad 17, along with the region in which the impurity in the pad 17 is diffused into the channel layer 15.

Therefore, in the embodiment of the present disclosure, the number of dummy transistors D_DT/S_DT is adjusted based on the junction overlap of the channel structure CH or the pad height H. For example, the junction overlap or the pad height H is compared with a reference value, and the number of the dummy transistors D_DT/S_DT is increased or decreased based on its comparison to the reference value. As previously disclosed, the "reference value" means a value desired in design, and may be a specific numerical value or have a predetermined numerical range. The comparison to the reference value is required due to a limitation in the manufacturing process, etc.

In an embodiment, when the junction overlap or pad height is smaller than the reference value, the number of the dummy transistors D_DT/S_DT is decreased, and in turn, the number of normal select transistors n_DST/n_SST is increased since the total number of drain-side dummy transistors D_DT and normal drain select transistors n_DST (D_DT+n_DST) may be the same in each of the memory strings and the total number of source-side dummy transistors D_DT and normal source select transistors n_SST (S_DT+n_SST) may be the same in each of the memory strings. When the junction overlap or pad height is greater than the reference value, the number of the dummy transistors D_DT/S_DT is increased, and in turn, the number of the normal select transistors n_DST/n_SST is decreased for the same reason as in the previous hypothetical.

Figure 6:
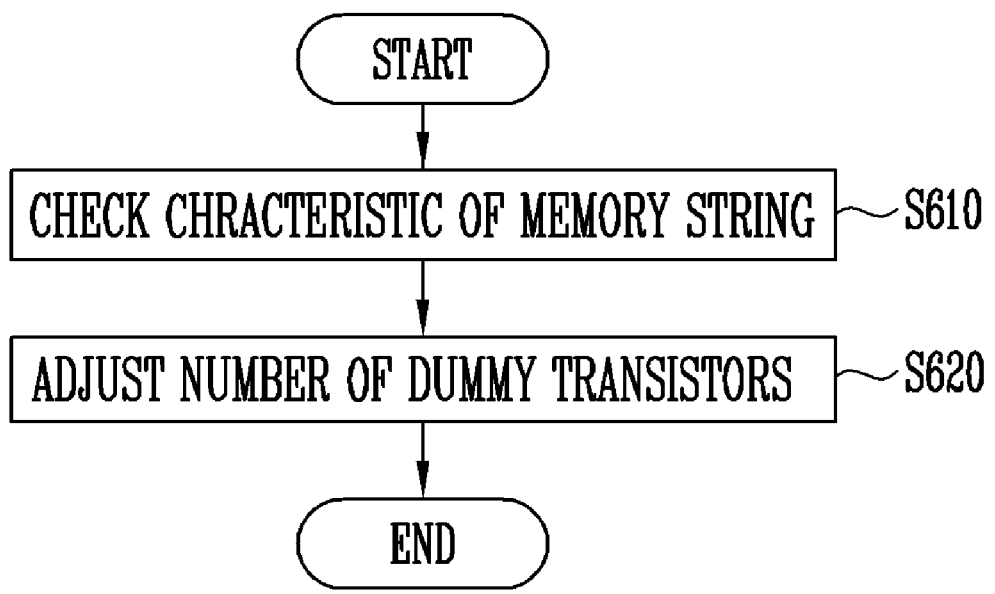
FIG. 6 is a flowchart illustrating a method of adjusting a number of dummy transistors of the semiconductor device in accordance with an embodiment of the present disclosure.

FIG. 6 is a flowchart, illustrating a method of adjusting a number of dummy transistors of the semiconductor device, in accordance with an embodiment of the present disclosure.

Referring to FIG. 6, step S610 includes checking the characteristic of the memory string MS. The characteristic of the memory string MS may be checked by checking the physical structure (pad height H or junction overlap of the channel structure CH) or the electrical characteristic (threshold voltage of the select transistor DST/SST). For example, with regard to checking the electrical characteristics, the amount of current flowing in a read operation may be measured or a threshold voltage of the select transistor DST/SST may be measured. Accordingly, measuring the electrical characteristics aids in estimating the physical structure of the memory string.

After step S601, step S602 adjusts the number of dummy transistors D_DT/S_DT based on the characteristic of the memory string MS. The number of the dummy transistors D_DT/S_DT may be adjusted for each memory string or for each memory block.

Specifically, when the pad height or junction overlap is greater than or equal to a reference value or when the threshold voltage is lower than a reference value, the number of the dummy transistors D_DT/S_DT may be increased by setting more normal select transistors n_DST/n_SST to be dummy transistors D_DT/S_DT. In turn, as the number of dummy transistors D_DT/S_DT increase, the number of normal select transistors n_DST/n_SST decreases since the total number of drain-side dummy transistors D_DT and normal drain select transistors n_DST (D_DT+n_DST) may be the same in each of the memory strings and the total number of source-side dummy transistors D_DT and normal source select transistors n_SST (S_DT+n_SST) may be the same in each of the memory strings. Accordingly, memory strings having different physical structures or different electrical characteristics have uniform operational characteristics. Furthermore, since the total number of drain-side dummy transistors D_DT and normal drain select transistors n_DST (D_DT+n_DST) may be the same in each of the memory strings and the total number of source-side dummy transistors D_DT and normal source select transistors n_SST (S_DT+n_SST) may be the same in each of the memory string, the structural integrity of the memory block and cell array is maintained.

FIGS. 7A and 7B are sectional views, illustrating a method of adjusting a number of dummy transistors of the semiconductor device, in accordance with an embodiment of the present disclosure.

Hereinafter, a detailed method of adjusting a number of dummy transistors will be described with reference to FIGS. 7A and 7B.

In an embodiment, the physical structure of the memory string MS is estimated by measuring the amount of current in a read operation. Based on the fact that one drain-side dummy transistor D_DT is between a drain select transistor DST and a bit line, the change in current is measured based on the change in bias level applied to a dummy line D_DL. Referring to Table 4, a bit line voltage Vbl is applied to a bit line BL, a pass voltage Vpass is applied to a word line WL, a turn-on voltage (e.g., 4.5V) is applied to a drain select line DSL and a source select line SSL, and a ground voltage (0V) is applied to a source line SL. Under these conditions, an amount of current is measured while splitting a voltage applied to a drain-side dummy line D_DL into 4V/5V/6V/7V/8V.

TABLE 4

| | |
|---|---|
| Bit line (BL) | Vbl (0.5 V) |
| Drain-side dummy line (D_DL) | Split (4 V/5 V/6 V/7 V/8 V) |
| Drain select line (DSL) | Von (4.5 V) |
| Word line (WL) | Vpass (7 V) |
| Source select line (SSL) | Von (4.5 V) |
| Source line (SL) | 0 V |

Specifically, the drain-side dummy transistor D_DT is turned on or turned off based on the bias voltage levels (4V/5V/6V/7V/8V), and based on the turning on and turning off of the drain-side dummy transistor D_DT, the amount of current changes. Therefore, the amount of current flow helps to determine at which bias voltage level the drain-side dummy transistor D_DT is turned on, thereby being able to estimate the height of the pad 17 or the junction overlap. Specifically, when a lower bias voltage level turns on the drain-side dummy transistor D_DT, the pad height and junction overlap is greater than a reference value. Accordingly, when only a higher bias voltage level turns on the drain-side dummy transistor D_DT, the pad height and junction overlap is smaller than the reference value.

Alternatively, the physical structure of the memory string MS may be estimated based on the change in the amount of current when the bias voltage level changes. For example, a steep slope of a current change (i.e., quick current change) may estimate that the pad height or the junction overlap may be greater than when the slope of the current change is flatter.

After estimating the pad height or junction overlap, the value is compared to the reference value. Referring to FIG. 7B, the pad height is much greater than the pad height of FIG. 7A. Therefore, based on FIG. 7B, the physical/electrical characteristic calculation would result in a value greater than the reference value. Therefore, the number of drain-side dummy transistors D_DT is adjusted. Specifically, in FIG. 7B, 2 of the normal drain select transistors n_DST is set as drain-side dummy transistors D_DT. Accordingly, the memory string of FIG. 7B includes three drain-side dummy transistors D_DT and one normal drain select transistor n_DST.

On the other hand, in a case where the pad height and junction overlap is smaller, the transistors would be set as normal drain select transistors n_DST. The pad height and junction overlap may be so small that a memory string may not have any drain-side dummy transistors D_DT.

Meanwhile, in the case of determining the adjustment of source select transistors, a similar method is used as in the case of the drain select transistors, but the amount of current is measured by applying a split voltage of 7V/8V/9V/10V.

In another embodiment, the physical structure of the memory string may be estimated based on the current when using a reference voltage in a read operation. Under conditions similar to those shown in Table 4, the reference voltage (e.g., 7V) is applied to the source-side dummy line D_DL shown in FIG. 7A. The amount of current flowing, when the reference voltage is applied, is compared with a reference value. When the amount of current is smaller than the reference value, the pad height and the junction overlap is smaller than the reference value. In turn, when the amount of current is greater than to the reference value, the pad height and the junction overlap is greater than the reference value. Therefore, as in FIG. 7B, when the height of the pad 17 or the junction overlap is different from the reference value, the number of the drain-side dummy transistors D_DT is adjusted.

In another embodiment, the physical structure of the memory string MS may be estimated by measuring the threshold voltage of the select transistors. Table 5 illustrates an example of a memory string including three sequentially-stacked drain select transistors DST0 to DST2 and one drain-side dummy transistor D_DT stacked on top of the select transistors. Table 5 discloses the threshold voltage of each of the drain-side dummy transistor D_DT and the drain select transistors DST0 to DST2.

TABLE 5

|      | Threshold voltage |
|------|-------------------|
| D_DT | −2 V              |
| DST2 | −0.1 V            |
| DST1 | 0 V               |
| DST0 | 0.2 V             |

Based on Table 5, the varying threshold voltage indicates that the transistors have different junctions. As previously explained, a threshold voltage lower than or equal to a reference value means that the height of the pad 17 and the junction overlap is greater than or equal to a reference value, which in turn means setting of more dummy transistors. For example, it is assumed that the reference value of the threshold voltage is 0V. Based on this assumption, the threshold voltage of the drain-side dummy transistor D_DT, of −2V, is lower than the reference value of 0V. Therefore, it may be determined that the height of the pad 17 or the junction overlap is greater than a reference value and will remain a dummy transistor. Furthermore, since the drain select transistors DST0 and DST1 have a threshold voltage of −0.1V and 0V, respectively, it may be determined that the pad 17 or the junction overlap is formed to a depth corresponding to the drain select transistor DST1. Therefore, based on Table 5 and the assumption that the reference value is 0V, the number of the drain-side dummy transistor D_DT is adjusted so that D_DT, DST2, and DST1 are set as dummy transistors.

Additionally, the physical structure of the memory string MS may be estimated based on a combination of the methods that have been described above.

FIGS. 8A to 8F are sectional views, illustrating a manufacturing method of the semiconductor device, in accordance with an embodiment of the present disclosure.

Referring to FIG. 8, a stack structure ST is formed. The stack structure ST includes first material layers 21 and second material layers 22, which are alternately stacked. Also, the stack structure ST may include a hard mask layer 23 at an uppermost portion of the stack structure ST. The first material layers 21 may be layers for forming gate electrodes of memory cells, select transistors, dummy transistors, and the like. Furthermore, the second material layers 22 may be layers for insulating the stacked gate electrodes from each other. The hard mask layer 23 may include the same material as the first material layers 21.

The first material layers 21 are formed of a material having a high etching selectivity with respect to the second material layers 22. For example, the first material layers 21 may be sacrificial layers including a nitride, and the second material layers 22 may be insulating layers including an oxide. In another example, the first material layers 21 may be conductive layers including tungsten, etc., and the second material layers 22 may be insulating layers including an oxide, etc. In still another example, the first material layers 21 may be conductive layers including doped polysilicon, etc., and the second material layers 22 may be sacrificial layers including undoped polysilicon, etc.

Subsequently, the opening OP are formed by penetrating the stack structure ST. The opening OP may have upper and lower portions that have a uniform thickness or have a width that decreases while approaching the lower portion.

Figure 8A:
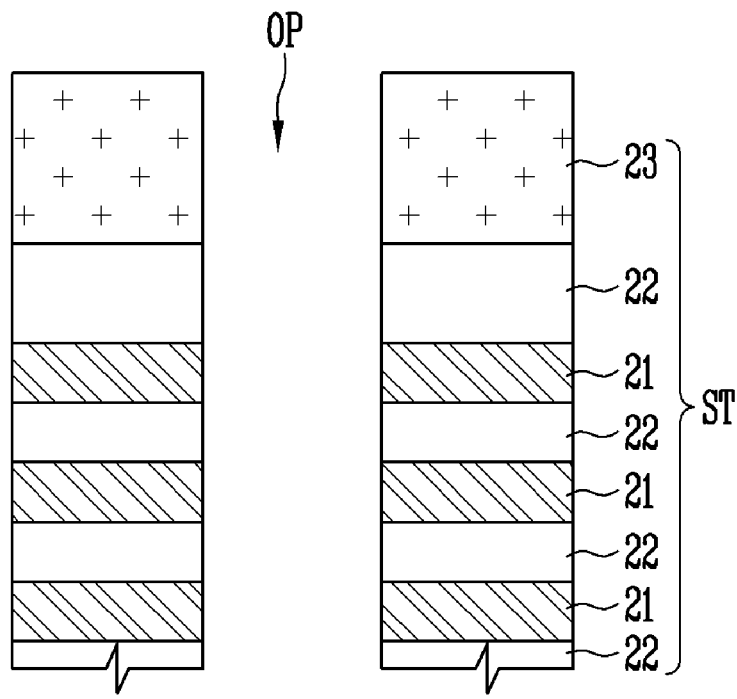
FIGS. 8A to 8F are sectional views illustrating a manufacturing method of the semiconductor device in accordance with an embodiment of the present disclosure.
Figure 8B:
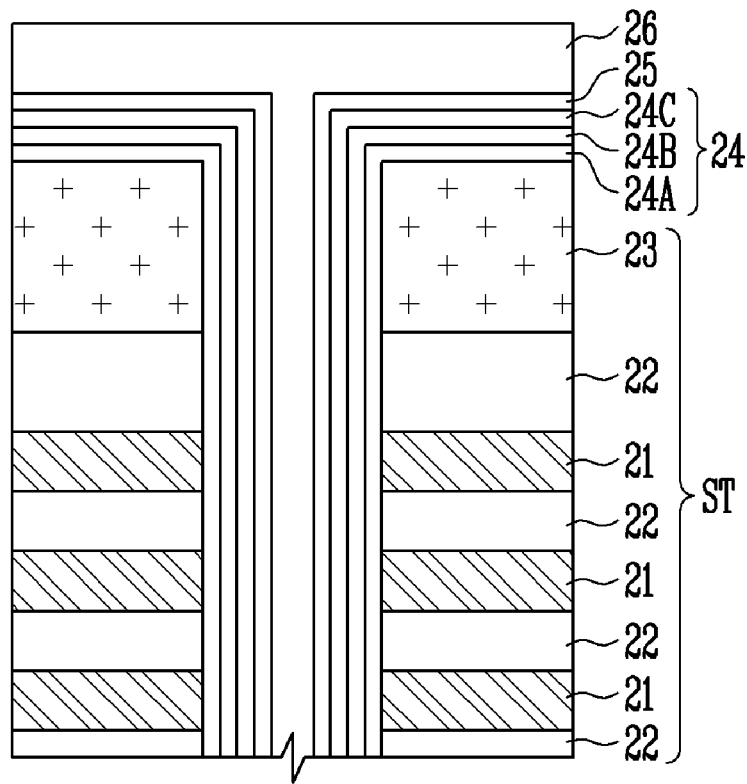

Referring to FIG. 8B, a memory layer 24 is formed in the opening OP. Specifically, the memory layer 24 may be formed to be in contact with the surface of the opening OP, conforming to the shape of the opening OP. The memory layer 24 may also be formed on the upper surface of the stack structure ST. In an embodiment, a charge blocking layer 24A, a data storage layer 24B, and a tunnel insulating layer 24C may be sequentially formed.

Subsequently, a channel layer 25 is formed on the surface of the memory layer 24, including the upper surface of the stack structure, in the opening OP.

Subsequently, a gap fill layer 26 is formed on the surface of the channel layer 25, including the upper surface of the stack structure, in the opening OP. The gap fill layer 26 may be formed to completely fill the the opening OP. Although not shown in the drawing, the gap fill layer 26 may include a void.

Figure 8C:
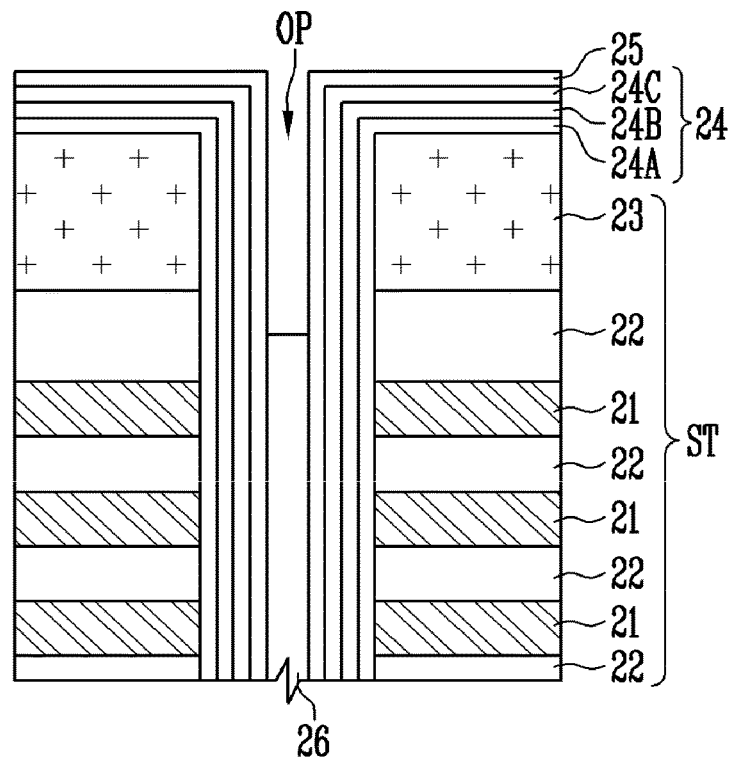

Referring to FIG. 8C, the gap fill layer 26 is etched, thereby re-opening a portion of the opening OP. The channel layer 25 may be etched along with the gap fill layer 26 in another embodiment. An upper surface of the gap fill layer 26 and an upper surface of the channel layer 25 may be substantially located at the same level.

The depth, to which the gap fill layer 26 is etched, determines the height of the pad. The re-opened region of the opening OP is a region in which a pad is to be formed in a subsequent process. Thus, a height of the pad is determined based on a depth to which the gap fill layer 26 is etched. The channel layer 25 may be etched together with the gap fill layer 26 when the gap fill layer 26 is etched. An upper surface of the gap fill layer 26 and an upper surface of the channel layer 25 may be substantially located at the same level.

Figure 8D:
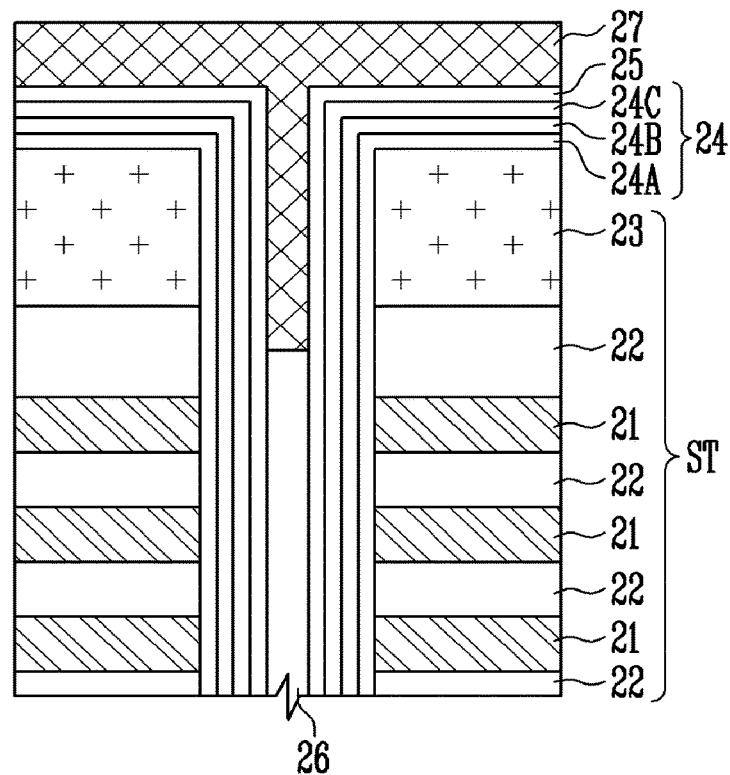

Referring to FIG. 8D, a pad layer 27 is formed in the portion of the opening OP and on the channel layer 25 on the upper surface of the stack structure ST. The pad layer 27 may be doped with an impurity, using an in-situ method, while in the process of being formed or after its formation.

Figure 8E:
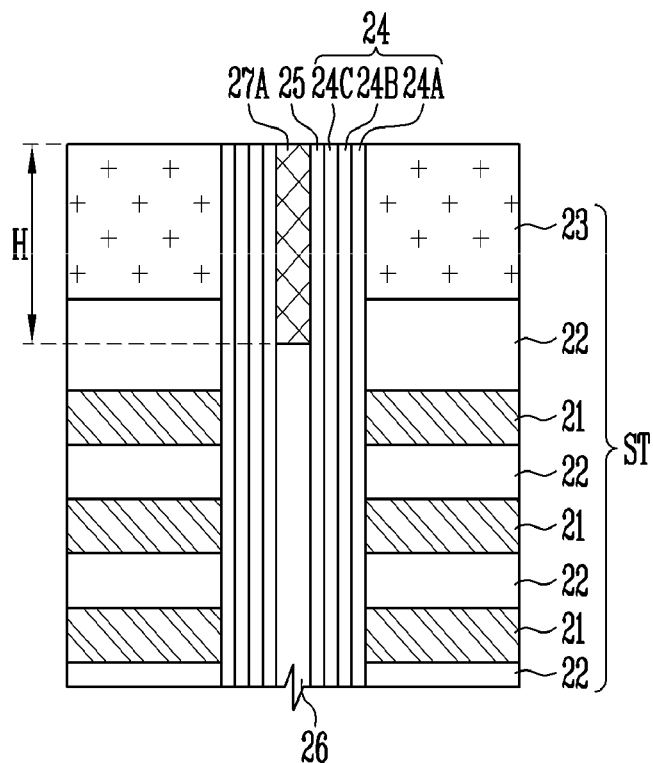

Referring to FIG. 8E, the pad layer 27, the channel layer 25, and the memory layer 24 are planarized until the upper surface of the stack structure ST is exposed. For example, the planarization is performed using a Chemical Mechanical Polishing (CMP) process. After planarization, a pad 27A is formed.

Figure 8F:
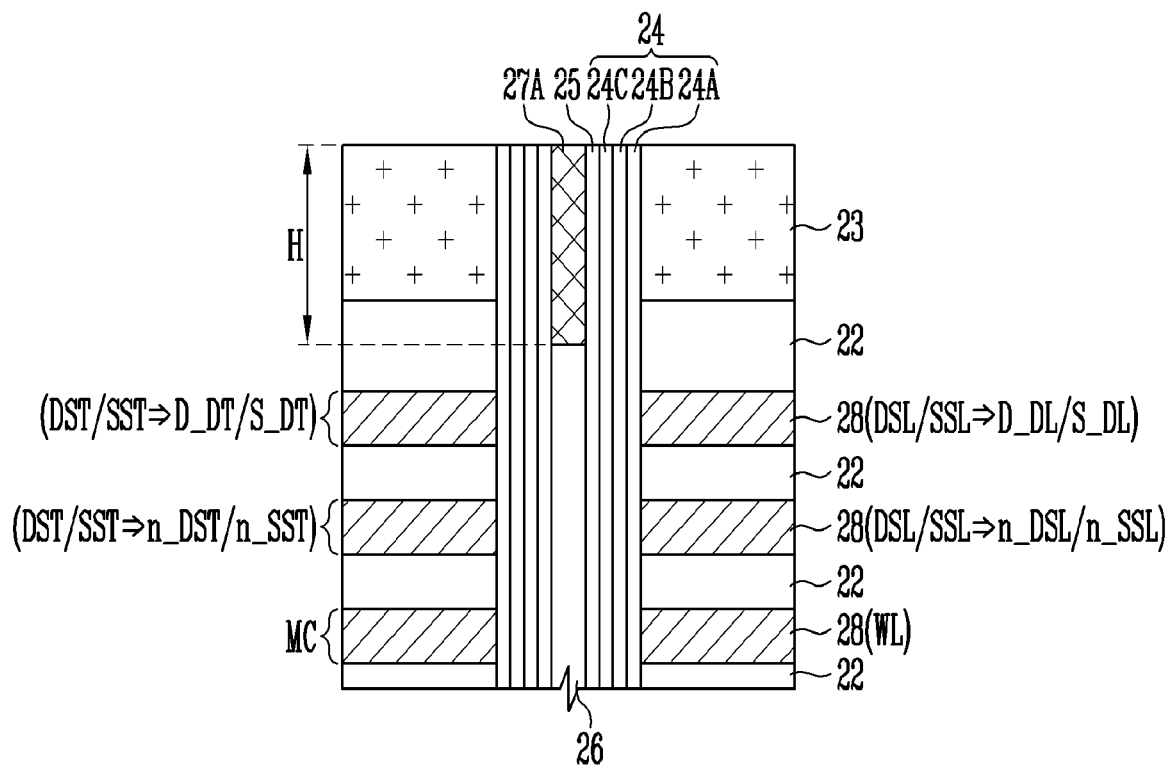

Referring to FIG. 8F, either the first material layers 21 or the second material layers 22 are replaced with third material layers 28. In an example, when the first material layers 21 are sacrificial layers and the second material layers 22 are insulating layers, the third material layers 28 may be conductive layers. In another example, when the first material layers 21 are conductive layers and the second material layers 22 are insulating layers, the third material layers 28 may be silicide layers. In still another example, when the first material layers 21 are conductive layers and the second material layers 22 are sacrificial layers, the second material layer 22 may be replaced with insulating layers.

Accordingly, memory cells MC and a plurality of select transistors DST/SST are formed along the channel layer 25.

Based on the process disclosed in FIGS. 8A-8F, the etching process of the gap fill layer 26 and the diffusion of impurities from the pad 27A to the channel layer 25 cannot be perfectly uniform. Therefore, the differences in the etching process of the gap fill layer 26 (FIG. 8C) results in different pad heights and the difference in the amount of diffusion of impurities results in the difference in junction overlap. This results in the varying threshold voltages of the select transistors. Therefore, a physical and electrical characteristics of memory strings MS are checked, and an adjustment is made in the number of dummy transistors. The characteristic check and the correction operation may be performed in a wafer test phase.

Based on the manufacturing methods described above, a semiconductor device may have a uniform operational characteristic based on a correction operation or a combination of the correction operations discussed above, even though the memory strings MS may have different pad heights or different junction overlaps.

Figure 9:
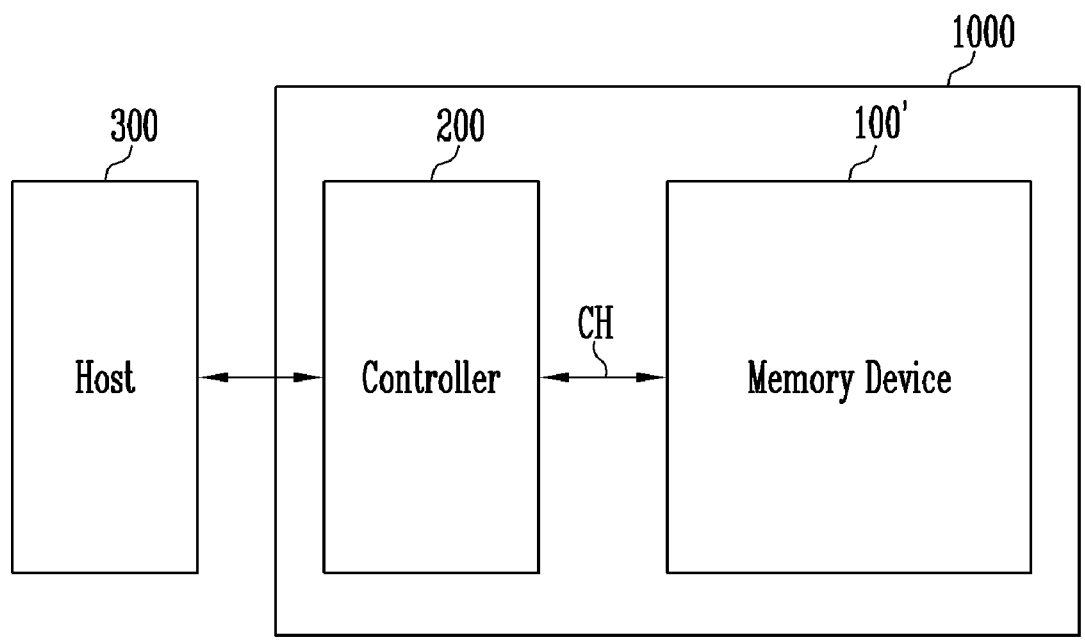
FIG. 9 is a block diagram illustrating a configuration of a memory system in accordance with an embodiment of the present disclosure.

FIG. 9 is a block diagram illustrating a configuration of a memory system in accordance with an embodiment of the present disclosure.

Referring to FIG. 9, the memory system 1000 includes a memory device 100' and a controller 200.

The controller 200 controls the memory device 100' through a channel CH, and the memory device 100' operates under the control of the controller 200. The memory device 100' includes a memory cell array having a plurality of memory blocks. In an embodiment, the memory device 100' may be the semiconductor device 100 described above, and be a flash memory device. The memory device 100' includes: a first memory string including a first drain-side dummy transistors, b first normal drain select transistors, a plurality of first memory cells, and at least one first normal source select transistor, wherein a is an integer of 0 or more, and b is an integer of 1 or more; and a second memory string including c second drain-side dummy transistors, d second normal drain select transistors, a plurality of second memory cells, and at least one second normal source select transistor, wherein c is an integer of 0 or more, and d is an integer of 1 or more. The number (a) of the first drain-side dummy transistors and the number (c) of the second drain-side dummy transistors may be different from each other.

The controller 200 controls the memory device 100' in response to a request from a host 300. In addition, the memory device 100' receives a command and an address from the controller 200 through the channel CH, and accesses an area selected by the address in the memory cell array. That is, the memory device 100' performs an internal operation corresponding to the command on the area selected by the address.

Also, the controller 200 may control the memory device 100' to perform a program operation, a read operation, an erase operation, or the like. In the program operation, the controller 200 provides the memory device 100' with a program command, an address, data, and the like through the channel CH, and the memory device 100' programs the data in an area selected by the address. In the erase operation, the controller 200 provides the memory device 100' with an erase command, an address, and the like through the channel CH, and the memory device 100' erase data stored in an area selected by the address. In the read operation, the controller 200 provides the memory device 100' with a read command, an address, and the like through the channel CH, and the memory device 100' reads data from an area selected by the address. The read operation includes not only a read operation for reading and outputting data stored in a memory cell but also a read operation as a verify operation accompanied by the program or erase operation.

Figure 10:
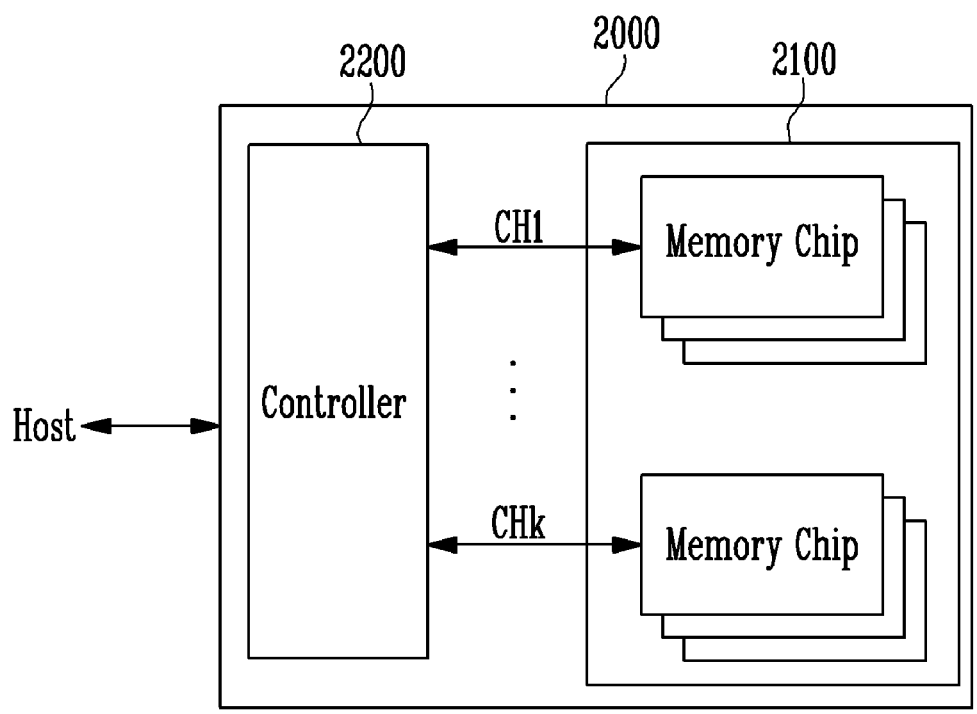
FIG. 10 is a block diagram illustrating a configuration of a memory system in accordance with an embodiment of the present disclosure.

FIG. 10 is a block diagram illustrating a configuration of a memory system in accordance with an embodiment of the present disclosure.

Referring to FIG. 10, the memory system 2000 includes a memory device 2100 and a controller 2200.

The memory device 2100 may be a semiconductor device, and include a plurality of memory chips. The plurality of memory chips are divided into a plurality of groups. The plurality of groups communicate with the controller 2200 respectively through first to kth channels CH1 to CHk. Each memory chip may be configured and operated similarly to the semiconductor device 100 described with reference to FIG. 1. Each memory chip includes: a first memory string including a first drain-side dummy transistors, b first normal drain select transistors, a plurality of first memory cells, and at least one first normal source select transistor, wherein a is an integer of 0 or more, and b is an integer of 1 or more; and a second memory string including c second drain-side dummy transistors, d second normal drain select transistors, a plurality of second memory cells, and at least one second normal source select transistor, wherein c is an integer of 0 or more, and d is an integer of 1 or more. The number (a) of the first drain-side dummy transistors and the number (c) of the second drain-side dummy transistors may be different from each other.

Each group communicates with the controller 2200 through one common channel. The controller 2200 is configured identically to the controller 200 described with reference to FIG. 16. The controller 2200 controls the plurality of memory chips of the memory device 2100 through the plurality of channels CH1 to CHk. The memory system 2000 may be modified such that one memory chip is coupled to one channel.

The controller 2200 and the memory device 2100 may be integrated into a single semiconductor device. In an embodiment, the controller 2200 and the memory device 2100 may be integrated into a single semiconductor device to constitute a memory card. For example, the controller 2200 and the memory device 2100 may be integrated into a single semiconductor device to constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro, and eMMC), an SD card (SD, miniSD, microSD and SDHC), and a Universal Flash Storage (UFS).

The controller 2200 and the memory device 2100 may be integrated into one semiconductor device to constitute a semiconductor drive (solid state drive (SSD)). The semiconductor drive SSD includes a storage device configured to store data in a semiconductor memory. When the memory system 2000 is used as the semiconductor drive SSD, the operating speed of a host Host, coupled to the memory system 2000, can be remarkably improved.

In another example, the memory system 2000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

Figure 11:
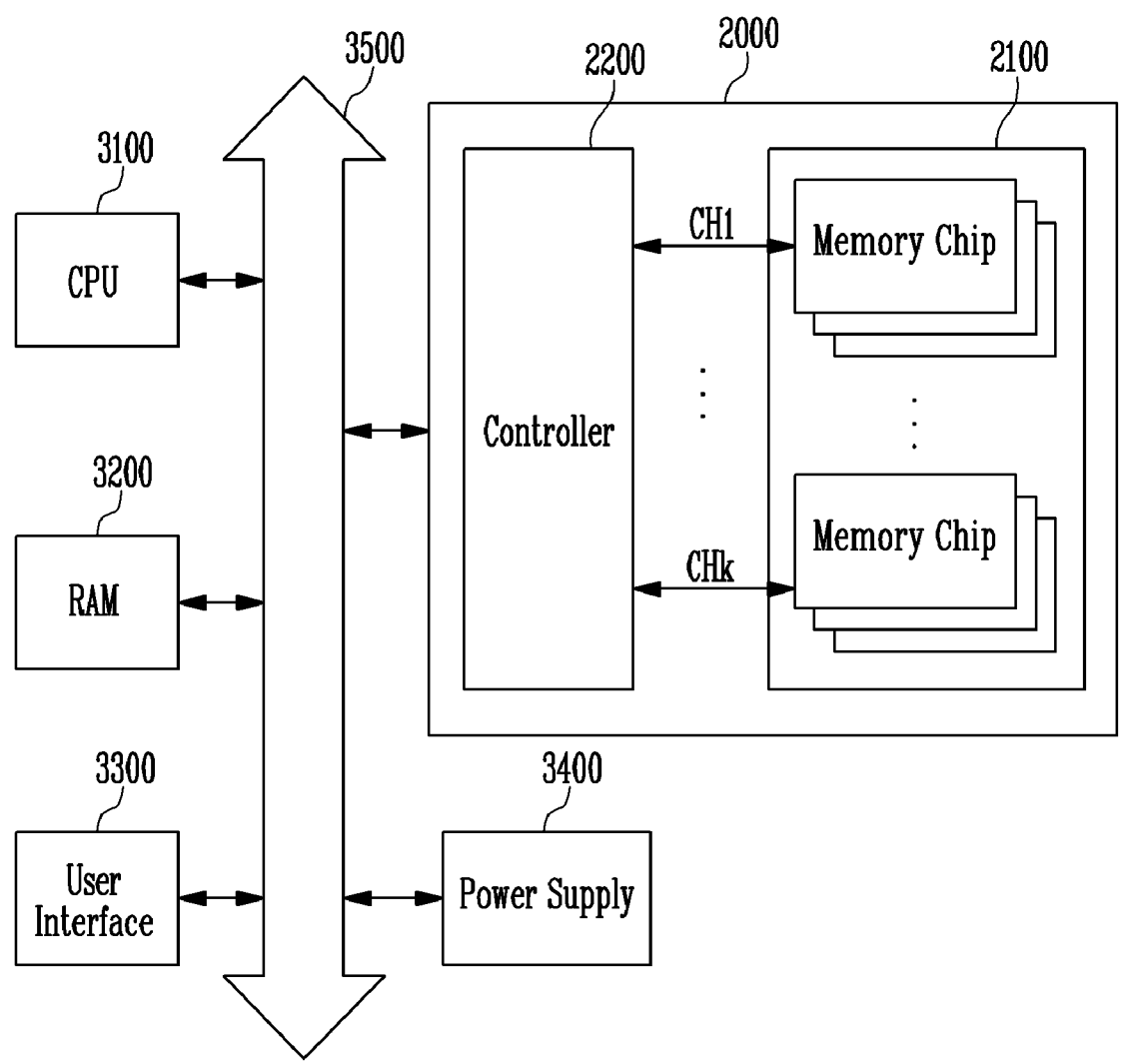
FIG. 11 is a block diagram illustrating a computing system in accordance with an embodiment of the present disclosure.

FIG. 11 is a block diagram illustrating a computing system in accordance with an embodiment of the present disclosure.

Referring to FIG. 11, the computing system 3000 includes a central processing unit 3100, a RAM 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

A memory device 2100 is coupled to the system bus 3500 through a controller 2200. When the memory device 2100 is directly coupled to the system bus 3500, the function of the controller 2200 may be performed by the central processing unit 3100 and the RAM 3200.

The computing system 3000 may be configured to include the memory system 2000 described with reference to FIG. 10 or to include the memory system 1000 described with reference to FIG. 9. In addition, the computing system 3000 may be configured to include both the memory systems 1000 and 2000 described with reference to FIGS. 9 and 10.

In accordance with the present disclosure, there can be provided a semiconductor device having improved operational characteristics and improved reliability, and a manufacturing method of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a first memory string including A first drain-side dummy transistors, B first normal drain select transistors, a plurality of first memory cells, and at least one first normal source select transistor, wherein A is a number of the first drain-side dummy transistors, wherein A is an integer of 0 or more, wherein B is a number of the first normal drain select transistors, wherein B is an integer of 1 or more; and
a second memory string including C second drain-side dummy transistors, D second normal drain select transistors, a plurality of second memory cells, and at least one second normal source select transistor, wherein C is a number of the second drain-side dummy transistors, wherein C is an integer of 0 or more, wherein D is a number of the second normal drain select transistors, wherein D is an integer of 1 or more,
wherein A and C are different integers from each other.

2. The semiconductor device of claim 1, wherein a total number (A+B) of the first drain-side dummy transistors and the first normal drain select transistors is equal to a total number (C+D) of the second drain-side dummy transistors and the second normal drain select transistors.

3. The semiconductor device of claim 1, wherein the first memory string and the second memory string have different physical structures.

4. The semiconductor device of claim 1, wherein the second memory string has a junction overlap greater than that of the first memory string, and C is a greater integer than A.

5. The semiconductor device of claim 1, wherein the first drain-side dummy transistor is located between the first normal drain select transistor and a bit line.

6. The semiconductor device of claim 1, wherein the first drain-side dummy transistor has a threshold voltage lower than that of the first normal drain select transistor.

7. The semiconductor device of claim 1, wherein the first memory string and the second memory string belong to the same memory block.

8. The semiconductor device of claim 1, wherein the first memory string and the second memory string belong to different memory blocks.

9. A semiconductor device comprising:
a source line;
a bit line; and
a plurality of memory strings between the source line and the bit line, each including at least one first dummy transistor, at least one first normal select transistor, a plurality of memory cells, and a plurality of second select transistors, wherein, a memory string having a greater junction overlap includes more first dummy transistors and less first normal select transistors than a memory string having a smaller junction overlap.

10. The semiconductor device of claim 9, wherein the at least one first dummy transistor is connected between the bit line and the at least one first normal select transistor.

11. The semiconductor device of claim 9, wherein total numbers of first dummy transistors and first normal select transistors, which are included in each of the plurality of memory strings, are equal to each other, and the memory strings include different numbers of first dummy transistors according to the junction overlaps.

12. The semiconductor device of claim 9, wherein the first dummy transistor has a threshold voltage lower than that of the first normal select transistor.

13. The semiconductor device of claim 9, wherein the plurality of second select transistors includes at least one second dummy transistor and at least one second normal select transistor,
wherein, a memory string having a greater junction overlap includes more second dummy transistors and less second normal select transistors than a second memory string having a smaller junction overlap.

14. The semiconductor device of claim 13, wherein the at least one second dummy transistor is connected between the source line and the at least one second normal select transistor.

15. The semiconductor device of claim 13, wherein a number of first dummy transistors included in one memory string and a number of second dummy transistors included in the corresponding memory string are equal to each other.

16. The semiconductor device of claim 13, wherein a number of first dummy transistors included in one memory string and a number of second dummy transistors included in the corresponding memory string are different from each other.

17. A method of manufacturing a semiconductor device, the method comprising:
forming a stack structure;
forming openings penetrating the stack structure;
forming channel layers respectively in the openings; and
forming pads connected to the channel layers in the openings,
wherein each of memory strings includes a plurality of memory cells, at least one normal select transistor, and at least one dummy transistor, which are stacked along the channel layer, and a number of normal select transistors included in each memory string and a number of dummy transistors included in the corresponding memory string are adjusted according to a height of the pads.

18. The method of claim 17, wherein a memory string having a pad of a greater height includes more dummy transistors and less normal select transistors than a memory string having a pad of a smaller height.

19. The method of claim 17, wherein the stack structure includes conductive layers and insulating layers, which are alternately stacked, and the conductive layers include word lines, at least one select line on the word lines, and at least one dummy line on the select line,
wherein a stack structure having a pad of a greater height includes more dummy lines and less select lines than a stack structure having a pad of a smaller height.

20. The method of claim 17, further comprising:
forming gap fill layers in the channel layers; and
etching the gap fill layers,
wherein the pads are formed in regions in which the gap fill layers are etched.

21. The method of claim 17, wherein the pads have an impurity concentration higher than that of the channel layers.

* * * * *